(12) United States Patent
Conti et al.

(10) Patent No.: US 12,231,080 B2
(45) Date of Patent: Feb. 18, 2025

(54) INTELLIGENT SOLAR RACKING SYSTEM

(71) Applicant: Conti SPE, LLC, Summit, NJ (US)

(72) Inventors: Kurt G. Conti, New Providence, NJ (US); Cullin J. Wible, Austin, TX (US)

(73) Assignee: CONTI INNOVATION CENTER, LLC, Orlando, FL (US)

( * ) Notice: Subject to any disclaimer, the term of this patent is extended or adjusted under 35 U.S.C. 154(b) by 172 days.

(21) Appl. No.: 17/841,442

(22) Filed: Jun. 15, 2022

(65) Prior Publication Data

US 2022/0407455 A1 Dec. 22, 2022
US 2023/0361716 A9 Nov. 9, 2023

Related U.S. Application Data

(60) Provisional application No. 63/211,262, filed on Jun. 16, 2021.

(51) Int. Cl.
| | |
|---|---|
| *H02S 30/10* | (2014.01) |
| *F16M 11/18* | (2006.01) |
| *H01L 31/043* | (2014.01) |
| *H01L 31/054* | (2014.01) |
| *H02S 50/10* | (2014.01) |

(52) U.S. Cl.
CPC ............ *H02S 30/10* (2014.12); *F16M 11/18* (2013.01); *H01L 31/043* (2014.12); *H01L 31/0547* (2014.12); *H02S 50/10* (2014.12)

(58) Field of Classification Search
CPC .................................. H02S 30/10; H02S 50/10
See application file for complete search history.

(56) References Cited

U.S. PATENT DOCUMENTS

| | | | |
|---|---|---|---|
| 4,461,922 | A | 7/1984 | Gay et al. |
| 4,909,857 | A | 3/1990 | Ondris et al. |
| 5,261,969 | A | 11/1993 | Stanbery |

(Continued)

FOREIGN PATENT DOCUMENTS

| | | |
|---|---|---|
| CN | 109037390 | 12/2018 |
| CN | 107341566 B | 7/2020 |

(Continued)

OTHER PUBLICATIONS

Vieira et al. "A Comprehensive Review on Bypass Diode Application on Photovoltaic Modules" Energies 13, No. 10: 2472 (2020).

(Continued)

*Primary Examiner* — Sadie White
(74) *Attorney, Agent, or Firm* — Volpe Koenig

(57) ABSTRACT

According to one or more embodiments, an intelligent solar racking system is provided. The intelligent solar racking system includes a racking frame that receives and mechanically supports solar modules. The intelligent solar racking system includes sensors distributed throughout the racking frame. Each of the sensors detects and reports parameter data by generating output signals. The sensors include module sensors positioned to associate with each of the solar modules and detect a module presence as the parameter data for the solar modules. The intelligent solar racking system includes a computing device that receives, stores, and analyzes the output signals to determine and monitor operations of the intelligent solar racking system.

14 Claims, 6 Drawing Sheets

(56) References Cited

U.S. PATENT DOCUMENTS

| | | |
|---|---|---|
| 5,393,675 A | 2/1995 | Compaan |
| 5,897,715 A | 4/1999 | Ward et al. |
| 5,922,142 A | 7/1999 | Wu et al. |
| 6,281,035 B1 | 8/2001 | Gessert |
| 6,458,254 B2 | 10/2002 | Gessert |
| 6,852,614 B1 | 2/2005 | Compaan et al. |
| 7,098,058 B1 | 8/2006 | Karpov et al. |
| 7,141,863 B1 | 11/2006 | Compaan et al. |
| 7,517,784 B2 | 4/2009 | Li et al. |
| 8,124,870 B2 | 2/2012 | Woods et al. |
| 8,143,515 B2 | 3/2012 | Gossman et al. |
| 8,224,189 B1 | 7/2012 | Frolov |
| 8,253,012 B2 | 8/2012 | Gessert et al. |
| 8,293,009 B2 | 10/2012 | Sachs et al. |
| 8,298,856 B2 | 10/2012 | Garnett |
| 8,425,978 B2 | 4/2013 | Gessert et al. |
| 8,448,898 B1 | 5/2013 | Frolov et al. |
| 8,455,808 B1 | 6/2013 | Frolov et al. |
| 8,461,504 B1 | 6/2013 | Frolov et al. |
| 8,519,435 B2 | 8/2013 | Vasko et al. |
| 8,568,828 B2 | 10/2013 | Li et al. |
| 8,580,603 B2 | 11/2013 | Basol |
| 8,633,052 B2 | 1/2014 | Polito et al. |
| 8,664,524 B2 | 3/2014 | Garnett |
| 8,696,810 B2 | 4/2014 | Hantsoo et al. |
| 8,734,621 B2 | 5/2014 | Gessert et al. |
| 8,746,620 B1 | 6/2014 | Moussouris et al. |
| 8,747,630 B2 | 6/2014 | Gessert et al. |
| 8,829,342 B2 | 9/2014 | Compaan et al. |
| 8,897,770 B1 | 11/2014 | Frolov et al. |
| 9,054,245 B2 | 6/2015 | Feldman-Peabody et al. |
| 9,090,403 B2 | 7/2015 | Ng et al. |
| 9,123,838 B2 | 9/2015 | Fogel et al. |
| 9,136,408 B2 | 9/2015 | Irwin et al. |
| 9,147,793 B2 | 9/2015 | Gessert et al. |
| 9,159,851 B2 | 10/2015 | Liu et al. |
| 9,269,849 B2 | 2/2016 | Yu et al. |
| 9,305,715 B2 | 4/2016 | Irwin et al. |
| 9,306,107 B2 | 4/2016 | Hong et al. |
| 9,331,292 B2 | 5/2016 | Irwin et al. |
| 9,391,700 B1 | 7/2016 | Bruce et al. |
| 9,416,279 B2 | 8/2016 | Irwin et al. |
| 9,425,346 B2 | 8/2016 | Polito et al. |
| 9,425,396 B2 | 8/2016 | Irwin et al. |
| 9,570,795 B1 | 2/2017 | Bruce et al. |
| 9,590,128 B2 | 3/2017 | Cauffiel et al. |
| 9,617,431 B2 | 4/2017 | Irwin et al. |
| 9,698,285 B2 | 7/2017 | Damjanovic et al. |
| 9,722,111 B2 | 8/2017 | Reese et al. |
| 9,750,795 B2 | 9/2017 | Weiner et al. |
| 9,758,257 B1 | 9/2017 | Frolov et al. |
| 9,799,784 B2 | 10/2017 | Allenic et al. |
| 9,841,616 B1 | 12/2017 | Bruce et al. |
| 9,853,177 B2 | 12/2017 | Yu et al. |
| 9,871,154 B2 | 1/2018 | Duggal et al. |
| 9,880,458 B1 | 1/2018 | Irwin et al. |
| 9,884,966 B2 | 2/2018 | Irwin et al. |
| 9,899,560 B2 | 2/2018 | Velappan et al. |
| 9,923,115 B2 | 3/2018 | Cauffiel et al. |
| 9,941,480 B2 | 4/2018 | Irwin et al. |
| 9,969,893 B2 | 5/2018 | Kim et al. |
| 9,991,457 B2 | 6/2018 | Irwin et al. |
| 10,043,922 B2 | 8/2018 | Heben et al. |
| 10,062,800 B2 | 8/2018 | Blaydes et al. |
| 10,072,351 B2 | 9/2018 | Sachs et al. |
| 10,141,473 B1 | 11/2018 | Blaydes et al. |
| 10,189,998 B2 | 1/2019 | Irwin et al. |
| 10,193,087 B2 | 1/2019 | Irwin et al. |
| 10,316,196 B2 | 6/2019 | Irwin et al. |
| 10,367,110 B2 | 7/2019 | Jin et al. |
| 10,439,095 B2 | 10/2019 | Jonczyk et al. |
| 10,505,240 B1 | 12/2019 | Bruce et al. |
| 10,529,883 B2 | 1/2020 | Damjanovic et al. |
| 10,549,476 B2 | 2/2020 | Sachs et al. |
| 10,608,190 B2 | 3/2020 | Irwin et al. |
| 10,633,765 B2 | 4/2020 | Jonczyk et al. |
| 10,642,147 B2 | 5/2020 | Irwin et al. |
| 10,651,323 B2 | 5/2020 | Gessert |
| 10,741,779 B2 | 8/2020 | Irwin et al. |
| 10,784,397 B2 | 9/2020 | Blaydes et al. |
| 10,797,641 B2 | 10/2020 | Irwin et al. |
| 10,896,991 B2 | 1/2021 | Jin et al. |
| 10,907,050 B2 | 2/2021 | Irwin et al. |
| 10,916,672 B2 | 2/2021 | Compaan et al. |
| 10,916,712 B2 | 2/2021 | Irwin et al. |
| 10,959,180 B2 | 3/2021 | Zhang et al. |
| 11,024,814 B2 | 6/2021 | Irwin et al. |
| 11,042,047 B1 | 6/2021 | Bruce et al. |
| 11,171,290 B2 | 11/2021 | Irwin et al. |
| 11,186,495 B2 | 11/2021 | Irwin et al. |
| 11,264,572 B2 | 3/2022 | Irwin et al. |
| 11,300,870 B2 | 4/2022 | Irwin et al. |
| 11,387,779 B2 | 7/2022 | Irwin et al. |
| 11,450,778 B2 | 9/2022 | Ring et al. |
| 11,508,924 B2 | 11/2022 | Irwin et al. |
| 11,562,920 B2 | 1/2023 | Steeman |
| 11,784,278 B2 | 10/2023 | Andreini et al. |
| 11,876,140 B2 | 1/2024 | Blaydes et al. |
| 2004/0118451 A1 | 6/2004 | Walukiewicz |
| 2005/0012113 A1 | 1/2005 | Sheu et al. |
| 2006/0180197 A1 | 8/2006 | Gui et al. |
| 2008/0216885 A1 | 9/2008 | Frolov et al. |
| 2009/0078318 A1 | 3/2009 | Meyers et al. |
| 2009/0095348 A1* | 4/2009 | Wegmann ............... H02S 50/00 136/258 |
| 2009/0146501 A1 | 6/2009 | Cyrus |
| 2009/0151775 A1* | 6/2009 | Pietrzak ................. H02S 20/10 136/251 |
| 2009/0178709 A1 | 7/2009 | Huber et al. |
| 2009/0182532 A1* | 7/2009 | Stoeber ............. H01L 31/02021 340/661 |
| 2009/0211622 A1 | 8/2009 | Frolov et al. |
| 2009/0215215 A1 | 8/2009 | Frolov et al. |
| 2009/0218651 A1 | 9/2009 | Frolov et al. |
| 2009/0221111 A1 | 9/2009 | Frolov et al. |
| 2009/0250096 A1 | 10/2009 | Pan |
| 2009/0250722 A1 | 10/2009 | Bruce et al. |
| 2009/0255567 A1 | 10/2009 | Frolov et al. |
| 2009/0308437 A1 | 12/2009 | Woods et al. |
| 2010/0005712 A1* | 1/2010 | Roccaforte ............. F24S 23/31 47/17 |
| 2010/0015753 A1 | 1/2010 | Garnett |
| 2010/0024876 A1 | 2/2010 | McClary et al. |
| 2010/0059101 A1 | 3/2010 | Shinohara |
| 2010/0084924 A1 | 4/2010 | Frolov et al. |
| 2010/0089441 A1 | 4/2010 | Frolov et al. |
| 2010/0098854 A1 | 4/2010 | Bruce et al. |
| 2010/0129957 A1 | 5/2010 | Frolov et al. |
| 2010/0154327 A1* | 6/2010 | Reyal ............. H01L 31/02008 52/173.3 |
| 2010/0170556 A1 | 7/2010 | Frolov et al. |
| 2010/0212714 A1 | 8/2010 | Rothschild et al. |
| 2010/0229923 A1 | 9/2010 | Frolov et al. |
| 2010/0233843 A1 | 9/2010 | Frolov et al. |
| 2010/0241375 A1* | 9/2010 | Kumar .................... H02S 40/38 702/62 |
| 2010/0288335 A1 | 11/2010 | Frolov et al. |
| 2010/0294346 A1 | 11/2010 | Frolov et al. |
| 2010/0294354 A1 | 11/2010 | Frolov et al. |
| 2010/0314238 A1 | 12/2010 | Frolov et al. |
| 2011/0024724 A1 | 2/2011 | Frolov et al. |
| 2011/0067757 A1 | 3/2011 | Frantz et al. |
| 2011/0095888 A1* | 4/2011 | Saluccio ............ G08B 13/1409 340/568.1 |
| 2011/0143489 A1 | 6/2011 | Korevaar |
| 2012/0000513 A1* | 1/2012 | Ben Izhak ............... F24S 25/67 136/251 |
| 2012/0019074 A1 | 1/2012 | Frolov et al. |
| 2012/0027924 A1 | 2/2012 | Castellano |
| 2012/0060923 A1 | 3/2012 | Zhao et al. |
| 2012/0097222 A1 | 4/2012 | Gessert et al. |
| 2012/0145240 A1 | 6/2012 | Carcia |
| 2012/0153341 A1 | 6/2012 | Vasko et al. |

(56) References Cited

U.S. PATENT DOCUMENTS

| | | |
|---|---|---|
| 2012/0233940 A1 | 9/2012 | Perkins et al. |
| 2013/0000693 A1* | 1/2013 | Waterhouse ............ F24S 25/13 |
| | | 136/246 |
| 2013/0068287 A1 | 3/2013 | Compaan |
| 2013/0074921 A1 | 3/2013 | Tang et al. |
| 2013/0174895 A1 | 7/2013 | Compaan et al. |
| 2013/0206217 A1 | 8/2013 | Liu et al. |
| 2013/0230944 A1 | 9/2013 | Feldman-Peabody et al. |
| 2014/0000690 A1 | 1/2014 | Plotnikov et al. |
| 2014/0000692 A1 | 1/2014 | Fogel et al. |
| 2014/0113156 A1 | 4/2014 | Jonczyk et al. |
| 2014/0196761 A1 | 7/2014 | Tilley et al. |
| 2014/0216534 A1 | 8/2014 | Hong et al. |
| 2014/0216542 A1 | 8/2014 | Shao et al. |
| 2014/0216550 A1 | 8/2014 | Damjanovic et al. |
| 2014/0261692 A1 | 9/2014 | Irwin et al. |
| 2014/0264988 A1 | 9/2014 | Bekele et al. |
| 2014/0275552 A1 | 9/2014 | Irwin et al. |
| 2014/0275602 A1 | 9/2014 | Irwin et al. |
| 2014/0284750 A1 | 9/2014 | Yu et al. |
| 2014/0302178 A1 | 10/2014 | Polansky |
| 2014/0333291 A1 | 11/2014 | Willis et al. |
| 2014/0360576 A1 | 12/2014 | Plotnikov et al. |
| 2015/0097071 A1 | 4/2015 | Frolov et al. |
| 2015/0097079 A1 | 4/2015 | Frolov et al. |
| 2015/0122947 A1 | 5/2015 | Bruce et al. |
| 2015/0144186 A1 | 5/2015 | Gessert |
| 2015/0171260 A1 | 6/2015 | Liu et al. |
| 2015/0207011 A1 | 7/2015 | Garnett et al. |
| 2015/0221790 A1 | 8/2015 | Heben et al. |
| 2015/0249172 A1 | 9/2015 | Irwin et al. |
| 2015/0280644 A1* | 10/2015 | Gostein ................ H02S 50/15 |
| | | 356/394 |
| 2015/0287872 A1 | 10/2015 | Cauffiel et al. |
| 2016/0060468 A1 | 3/2016 | Kim et al. |
| 2016/0118934 A1* | 4/2016 | Johnson ................ H02S 40/30 |
| | | 136/244 |
| 2016/0126395 A1 | 5/2016 | Damjanovic et al. |
| 2016/0126397 A1 | 5/2016 | Yu et al. |
| 2016/0240796 A1 | 8/2016 | Irwin et al. |
| 2016/0344330 A1 | 11/2016 | Gillis |
| 2016/0363938 A1 | 12/2016 | Frolov et al. |
| 2017/0040933 A1 | 2/2017 | Vogel |
| 2017/0094142 A1 | 3/2017 | Irwin et al. |
| 2017/0125625 A1 | 5/2017 | Cauffiel et al. |
| 2018/0001975 A1 | 1/2018 | Jaramillo |
| 2018/0054156 A1 | 2/2018 | Lokey |
| 2018/0076764 A1 | 3/2018 | Irwin et al. |
| 2018/0083151 A1 | 3/2018 | Shibasaki et al. |
| 2018/0254741 A1* | 9/2018 | Jones ................ B08B 1/12 |
| 2018/0301288 A1 | 10/2018 | Irwin et al. |
| 2018/0302021 A1* | 10/2018 | Hall ................ H02J 7/34 |
| 2018/0317289 A1 | 11/2018 | Frolov et al. |
| 2019/0018793 A1 | 1/2019 | Tarin |
| 2019/0115974 A1 | 4/2019 | Frolov et al. |
| 2019/0181793 A1 | 6/2019 | Azad et al. |
| 2019/0296174 A1 | 9/2019 | Gloeckler et al. |
| 2019/0305166 A1 | 10/2019 | Compaan et al. |
| 2019/0341506 A1 | 11/2019 | Sampath et al. |
| 2019/0393828 A1* | 12/2019 | Huuhtanen ............ F24S 50/00 |
| 2020/0052643 A1 | 2/2020 | Ballentine et al. |
| 2020/0106518 A1 | 4/2020 | Frolov et al. |
| 2020/0157125 A1 | 5/2020 | Irwin et al. |
| 2020/0206771 A1 | 7/2020 | DeVos |
| 2020/0332408 A1 | 10/2020 | Irwin et al. |
| 2021/0006201 A1* | 1/2021 | Hinson ................ G01S 3/7861 |
| 2021/0143350 A1 | 5/2021 | Irwin et al. |
| 2021/0211095 A1* | 7/2021 | Xu ................ H02S 50/10 |
| 2022/0069151 A1 | 3/2022 | Powell et al. |
| 2022/0085226 A1 | 3/2022 | Okumura et al. |
| 2023/0317870 A1 | 10/2023 | Peng et al. |

FOREIGN PATENT DOCUMENTS

| | | | |
|---|---|---|---|
| DE | 102011087672 A1 | 8/2012 | |
| DE | 102011089916 A1 | 6/2013 | |
| WO | 2009/105683 | 8/2009 | |
| WO | 2011035234 A1 | 3/2011 | |
| WO | 2011142804 A1 | 11/2011 | |
| WO | 2014028526 A2 | 2/2014 | |
| WO | 2015126918 A1 | 8/2015 | |
| WO | WO-2017144772 A1 * | 8/2017 | ............ F24S 50/00 |
| WO | 2018/071509 | 4/2018 | |
| WO | 2018/085829 | 5/2018 | |
| WO | WO-2019085541 A1 * | 5/2019 | .......... G01M 99/005 |
| WO | 2020065060 A1 | 4/2020 | |
| WO | 2020246074 A1 | 12/2020 | |

OTHER PUBLICATIONS

Comprehensive Guide on Organic and Inorganic Solar Cells, Fundamental Concepts to Fabrication Methods, 1st Edition (Nov. 16, 2021).

Subedi et al., "Enabling bifacial thin film devices by developing a back surface field using CuxAlOy". United States (2021).

Hall et al., Back contacts materials used in thin film CdTe solar cells—A review. Energy Sci Eng. 2021; 9: 606-632 (2021).

Liu et al., "High-Efficiency Isolated Photovoltaic Microinverter Using Wide-Band Gap Switches for Standalone and Grid-Tied Applications" Energies 11, No. 3: 569 (2018).

Materials for Solar Energy Conversion: Materials, Methods and Applications, R. Rajasekar (Editor), C. Moganapriya (Editor), A. Mohankumar (Editor), ISBN: 978-1-119-75060-4 (Nov. 2021).

Subedi et al., "Nanocomposite (CuS)x(ZnS)1-x Thin Film Back Contact for CdTe Solar Cell: Toward a Bifacial Device," (2018).

Bauwens et al., "NMOS-Based Integrated Modular Bypass for Use in Solar Systems (NIMBUS): Intelligent Bypass for Reducing Partial Shading Power Loss in Solar Panel Applications" Energies 9, No. 6: 450 (2016).

Prism Solar Data Sheet, BN72 Bifacial Modules, 72-Cell Bifacial Series BN72-370, Available at: https://static1.squarespace.com/static/57a12f5729687f4a21ab938d/t/5e509ebbdbfcb2688ef27902/1582341820082/Prism+Solar+~+BN72+~+Gen2+-+360-370W+~+v1.2.pdf (2020).

International Search Report and Written Opinion for Application No. PCT/US2022/033603 dated Sep. 28, 2022.

International Search Report and Written Opinion for Application No. PCT/US2022/033612 dated Sep. 23, 2022.

International Search Report and Written Opinion for Application No. PCT/US2022/033659 dated Oct. 5, 2022.

Spanias Andreas S: "Solar energy management as an Internet of Things (IoT) application", 2017 8th International Conference on Information, Intelligence, Systems & Application (IISA), IEEE, Aug. 27, 2017 (Aug. 27, 2017), pp. 1-4, XP033331189, DOI: 10.1109/IISA.2017.8316460 [retrieved on Mar. 14, 2018] p. 1, right-hand column, p. 1, right-hand column, paragraph 4-p. 3, left-hand column, paragraph 1; figures 2,4.

Non-Final Office Action for U.S. Appl. No. 17/841,218 dated Feb. 16, 2023.

International Preliminary Report on Patentability received in related international application No. PCT/US2022/033659, mailed Jul. 25, 2023, 35 pages.

Non-Final Office Action for U.S. Appl. No. 17/841,239 dated Aug. 16, 2023.

International Preliminary Report on Patentability Chapter II dated Jan. 23, 2024 for PCT International Application No. PCT/US2022/041026.

International Search Report and Written Opinion mailed on Feb. 16, 2023 for PCT International Application No. PCT/US2022/041026.

Sharma et al., "CdZnTe thin films as proficient absorber layer candidates in solar cell devices: a review" (2023).

Samoilenko, "Development of Ii-Vi Ternary Alloys For CDTE-Based Solar Cells" (2020).

(56) References Cited

OTHER PUBLICATIONS

Sharma et al., "Review on bandgap engineering in metal-chalcogenide absorber layer via grading: A trend in thin-film solar cells," Solar Energy, vol. 246, pp. 152-180 (2022).

Hossain et al., "Tuning the bandgap of $Cd_{1-x}Zn_xS$ (x=0~1) buffer layer and CIGS absorber layer for obtaining high efficiency," Superlattices and Microstructures, vol. 161, (2022).

Bastola et al., "Cadmium Selenide (CdSe) as an Active Absorber Layer for Solar Cells with Voc Approaching 750 mV," 2023 IEEE 50th Photovoltaic Specialists Conference (PVSC), San Juan, PR, USA, 2023, pp. 1-6 (2023).

McCandless et al., "$Cd_{1-x}Zn_xTe$ Solar Cells with 1.6 eV Band Gap" (2005).

Xue et al., Recent progress on solution-processed CdTe nanocrystals solar cells, (Jul. 4, 2016).

Liu et al., Solution processed CdTe/CdSe nanocrystal solar cells with more than 5.5% efficiency by using an inverted device structure, (Mar. 10, 2015).

Ju et al., Thickness dependence study of inorganic CdTe/CdSe solar cells fabricated from colloidal nanoparticle solutions, (May 15, 2010).

Kapadnis et al., Cadmium telluride/cadmium sulfide thin films solar cells: a review, (Sep. 30, 2020).

International Preliminary Report on Patentability received in related international application No. PCT/US2022/033612, mailed Aug. 18, 2023, 7 pages.

International Preliminary Report on Patentability received in related international application No. PCT/US2022/033603, mailed Oct. 11, 2023, 8 pages.

Streetman et al., "Solid State Electronic Devices," Solid State Electronic Devices, 6th Edition (Aug. 5, 2005).

U.S. Department of Energy, EERE Funding Opportunity Exchange, "DE-FOA-0003058: Advancing U.S. Thin-Film Solar Photovoltaics," (2023).

NREL, "News Release: NREL Awards $2 Million in Contracts To Support Development of Cheaper, More Efficient Cadmium Telluride Solar Cells," (Jun. 22, 2023).

Streetman, Solid State Electronic Devices. Third Edition. (Prentice Hall series in solid state physical electronics), 3rd Edition, pp. 144-148 (1990).

Sze, "Physics of Semiconductor Devices," Second Edition, pp. 74-84 (1981).

* cited by examiner

INTELLIGENT SOLAR RACKING SYSTEM

CROSS REFERENCE TO RELATED APPLICATIONS

This application claims priority from U.S. Provisional Patent Application No. 63/211,262, entitled "MODULAR SOLAR SYSTEM," filed on Jun. 16, 2021, which is hereby incorporated by reference as if set forth in full in this application for all purposes.

FIELD OF INVENTION

The present invention is related to solar power generation by a modular solar system. More particularly, the disclosure herein include an intelligent solar racking system that manages and monitors mechanically stacked solar transmissive cells or modules for solar power generation.

BACKGROUND

Currently, there are no economically viable techniques for conventional photovoltaic solar cells to achieve power conversion efficiencies greater than 25%. As a result, at least 75% of the sun's energy hitting earth's surface is unused.

SUMMARY

According to one or more embodiments, an intelligent solar racking system is provided. The intelligent solar racking system includes a racking frame configured to receive and mechanically support one or more solar modules. The intelligent solar racking system includes a plurality of sensors distributed throughout the racking frame. Each of the plurality of sensors configured to detect and report parameter data by generating output signals. The plurality of sensors include one or more module sensors positioned to associate with each of the one or more solar modules and detect at least a module presence as the parameter data for the one or more solar modules. The intelligent solar racking system includes at least one computing device configured to receive, store, and analyze the output signals to determine and monitor operations of the intelligent solar racking system.

According to one or more embodiments, a method is provided. The method includes monitoring, by at least one computing device, output signals generated by a plurality of sensors distributed throughout a racking frame of an intelligent solar racking system. Each of the plurality of sensors configured to detect and report parameter data in the output signals. The racking frame configured to receive and mechanically support one or more solar modules. The plurality of sensors comprising one or more module sensors positioned to associate with each of the one or more solar modules. The method includes determining, by the at least one computing device, operations of the intelligent solar racking system based on the output signals.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

A more detailed understanding may be had from the following description, given by way of example in conjunction with the accompanying drawings, wherein like reference numerals in the figures indicate like elements, and wherein.

DETAILED DESCRIPTION

Disclosed herein is a modular solar system. More particularly, the modular solar system relates to an intelligent solar racking system that manages and monitors mechanically stacked solar transmissive cells or modules for solar power generation. According to one or more embodiments, the intelligent solar racking system can include a racking frame configured to receive and mechanically support solar modules. The intelligent solar racking system can include sensors distributed throughout the racking frame. Note that each of the sensors detect and report parameter data by generating output signals. The sensors can include module sensors positioned to associate with each of the solar modules to detect at least a module presence as the data parameter for the solar modules. The intelligent solar racking system can include a computing device that receives, stores, and analyzes the output signals to determine and monitor operations of the intelligent solar racking system. According to one or more technical effects, advantages, and benefits, the modular solar system achieves electrical output efficiency that is greater than conventional photovoltaic solar cells (e.g., electrical output efficiency can include ensuring optimization the 25% power conversion efficiencies by the conventional photovoltaic solar cells and beyond).

Figure 1:
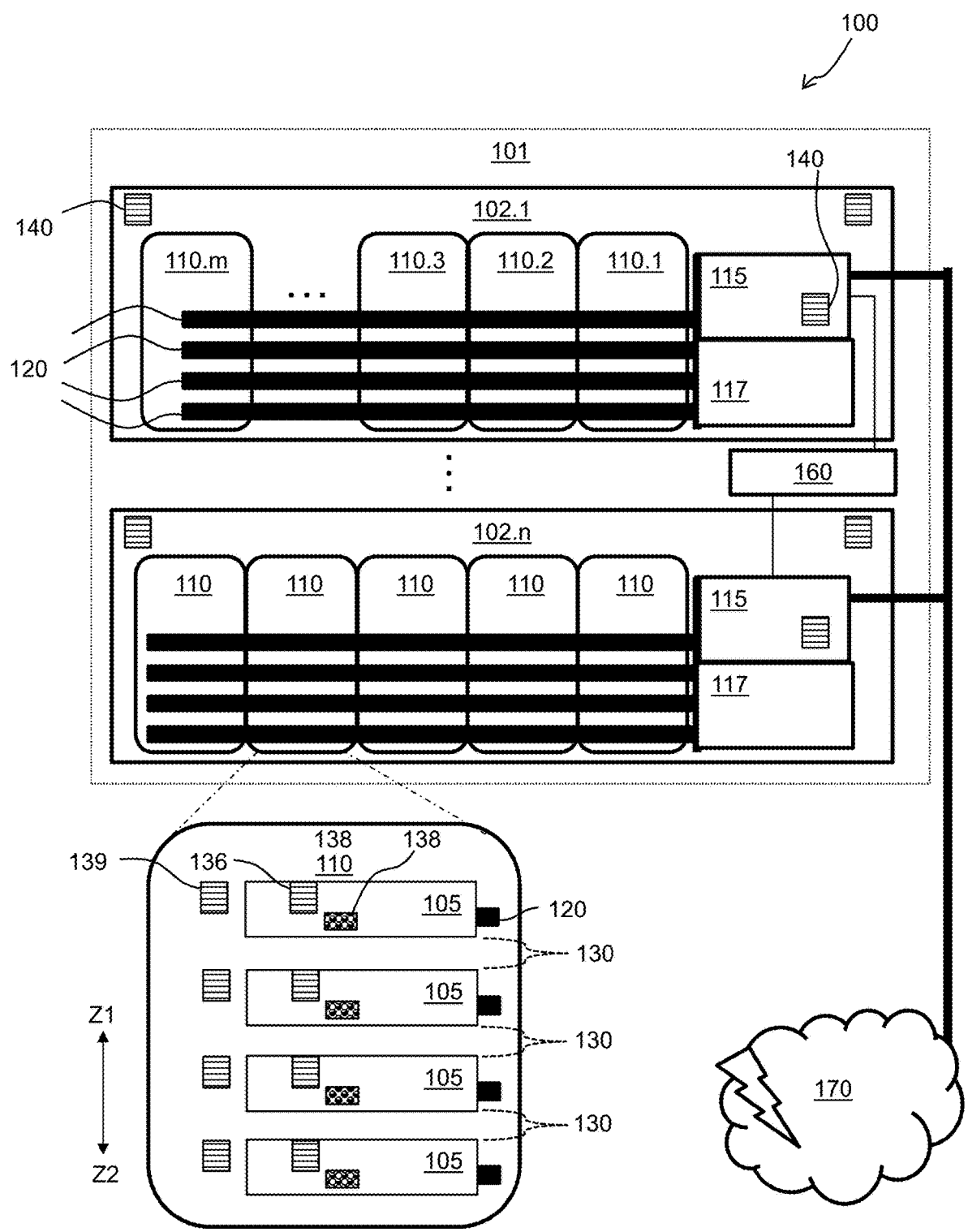
FIG. 1 depicts an environment according to one or more embodiments.

Turning now to FIG. 1, an environment 100 is illustrated according to one or more embodiments. The environment 100 can include one or more modular solar systems (i.e., solar module racking system for solar power generation) as discussed herein. Embodiments of the environment 100 include apparatuses, systems, methods, and/or computer program products at any possible technical detail level of integration. Note that, by way of example in conjunction with the other drawings, like reference numerals in the figures indicate like elements and will not be reintroduced for brevity.

According to one or more embodiments, the environment 100 can be representative of the modular solar system located within a field 101 and including one or more systems 102.n (where n is an integer). More particularly, the environment 100 can include systems 102 (which can represent any of the systems described herein) that support one or more mechanically stacked solar transmissive modules (i.e., the one or more modules 105) within one or more frames 110 (which can represent any of the frames described herein) to receive and convert light energy (e.g., from at least the sun 201 of FIG. 2, though other sources are contemplated). The solar transmissive modules include transmissivity qualities. Transmissivity allows light energy (i.e., irradiance) to pass through something. In this way, embodiments of the environment 100 include apparatuses, systems, methods, and/or computer program products at any possible technical detail level of integration.

The field 101 can be any terrain or expanse of open or cleared ground for supporting the one or more systems 102.n, as well as rooftops and/or other property areas. For example, any single component of the system 102 can be placed within the field 101, such as a being placed directly on a roof without a post, a cap, and/or a beam arrangement. Each system 102 can be considered a support structure, a framework, and a stacking structure. Each system 102 includes at least an inverter 115, a switch 117, a string 120, and the one or more frames 110 (where m is an integer).

Figure 2:
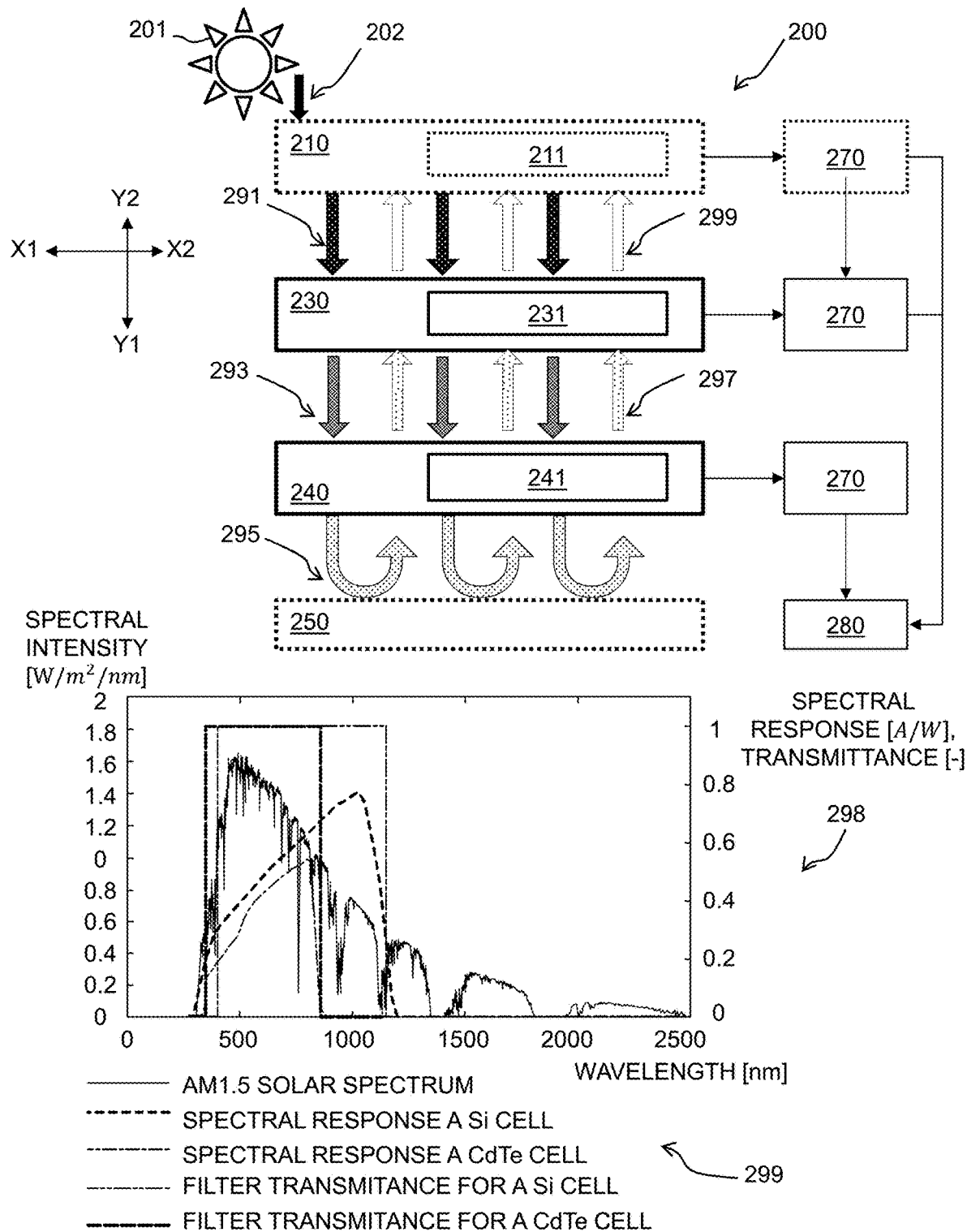
FIG. 2 depicts a system according to one or more embodiments.

Each frame 110 can include the one or more modules 105 (e.g., the modules 210, 230, and 240 of FIG. 2). According to one or more embodiments, the one or more modules 105 can receive and convert light energy and can comprise at least one transmissive solar module. Each frame 110 can electrically connect each of the modules 105 upon that solar module being inserted into racking frame 110. Each frame 110 is system that can be built in a factory (i.e., robotically or not) and can act as a structural assembly for custom modules. Each frame 110 can include T-frame members and L-frame members, as well as flat stock. A top surface/area and/or a bottom surface/area of each frame 110 can remain open. A beam arrangement of the system 102 supports each frame 110. The beam arrangement can be a C-channel support. The flat stock can support one or more electrical snap-in power sensors, each corresponding to a module location where each frame 110 can receive a module.

The inverter 115 can be any power electronic device or circuitry that changes between currents, such as direct current (DC) to alternating current (AC). The switch 117 can be a de-energizing switch that grounds each system 102. According to one or more embodiments, the switch 117 provides electrical latching, when the systems 102 is energized, and prevents ejection. The string 120 can be any electronic configuration that connects one or more electrical components (e.g., the one or more modules 105), whether in series or in parallel to a particular electrical component (e.g., such as the inverter 115). The string 120 can include a plurality of pre-wired receptacles for rapid assembly of the one or more modules 105 into the frames 110.

Each module 105 is connected to a corresponding string 120 (e.g., via a pre-wired receptacle, a pin connection, a pig tail connection, or the like) and has an interim section 130 (e.g., proximate or adjacent) defining a distance from other modules 105.

Adjacent in this context includes two components being next to, in contact with, or adjoining (e.g., effectively touching) without being bonded together, and in some cases being stacked directly on top of each other. The interim section 130 can be maintained by a seal or the like on a perimeter. The seal can include, but is not limited to, one or more of a glue or other adhesive, a gasket, a plastic member, and a gap filler. According to one or more embodiments, the seal is a combination of a gap filler and a glue or other adhesive. According to one or more embodiments, the interim section 130 is sealed on a perimeter to support the mechanical stacking, as well as to prevent foreign objects (e.g., dust, insects, rodents, or the like) from penetrating between the modules 105.

Proximate in this context includes two components being near, close to, or at some predefined distance without being bonded together. Examples of proximate can include, but are not limited to, 1 millimeter, 5 millimeter, 1 centimeter, 5 centimeters, 1 decimeter, 5 decimeters, or the like. The space (i.e., the interim section 130) can be maintained by a seal as described herein and/or by the frame 110. According to one or more embodiments, the frame 110 supports and secures the mechanical stacking, as well as provides the seal on one or more sides of the modules 105. Examples of the seal of the frame 110 include, but are not limited to, a screen, a water tight membrane, or an air filter. Example of mechanical stacking includes, but are not limited to, horizontal stacking, parallel stacking with a plane of a horizon (i.e., flat to the earth), and parallel stacking with a plane of a solar array (i.e., design determined).

The systems 102 can include a plurality of sensors (e.g., any of the sensors 136, 139, and 140). The any of the sensors 136, 139, and 140 can be a transducer configured to convert one or more conditions of the environment 100 into an electrical signal (e.g., output signal). For example, any of the sensors 136, 139, and 140 can include one or more of an electrode, a temperature sensor (e.g., thermocouple), a current sensor, a photosensor, an accelerometer, a microphone, a radiation sensor, a proximity sensor, position sensor, and a long range (LoRa) sensor (e.g., any low-power wide-area network modulation sensor). Any of the sensors 136, 139, and 140 can further represents relays, LoRa radios, global positioning system (GPS) units, etc., each of which further facilitate detecting and communicating conditions of the environment 100.

According to one or more embodiments, each module 105 can include at least one sensor 136 (e.g., internal sensor), as well as a code 138. For example, the modules 105 can be an intelligent module that includes internal sensors (e.g., the sensor 136). Note that the modules 105 can also be conventional solar technologies, which can be detected and monitored by the environment 100.

Further, additional sensors 139 and 140 can be located through the systems 102 and the environment 100. The sensors 139 can be considered module sensors, and the sensors 140 can be considered frame sensors (associated with and distributed throughout the frame 110). The environment 100 and elements therein (e.g., any of the sensors 136, 139, and 140) can be managed a device 160 (e.g., the computing device 305, ARM processor or the like). For instance, the device 160 can manage and receive output signals from multiple sets of sensors 136, 139, and 140 from different/multiple frames 110 and systems 102 (e.g., the device 160 can collect the output signals from one or more of sensors 136, 139, and 140 associated with and distributed throughout the frame 110.1 of the system 102.1 and the frame 110.1 of the system 102.2). That is, the systems 102 can include a plurality of sensors (e.g., any of the sensors 136, 139, and 140) that communicate with the device 160. The device 160 can automatically determine a position of each of the modules 105 within the frame 110. Further, the environment 100 can be connected to a grid 170 and can be managed by a maintenance robot, a drone, a maintenance service provider, a technician, or the like.

According to one or more embodiments, the system 102 and the frames 110 can be assembled in a factory setting, including pre-wiring to reduce field assembly costs in the field 101 while increasing quality. In this regard, the plurality of sensors can be pre-wired throughout the frames 110. When the frames 110 are shipped to the field 101, the frames 110 can be connected together and erected (e.g., like a puzzle). The one or more frames 110 can have dimensions to accommodate modules 105 (e.g., 1×2 meters in length and width) and to provide spacing that accommodates cooling and bandgap distribution. According to one or more embodiments, 1 inch high modules with 1 inch spacing therebetween provides an 8 inch high module (e.g., that may look like a pancake stack). In turn, the system 102 can provide lateral stability side to side, while the one or more modules 105 provides stability front to back stability. According to one or more embodiments, the one or more modules 105 can be adjacent (e.g., may be stacked directly on top of each other without spacing therebetween).

According to one or more embodiments, the environment 100 includes the systems 102, the frames 110, and the one or more modules 105 in the field 101 with sensors 136. The environment 100 illustrates, on a macro level, how elements and components are connected within a greater network for alerts, as well as to provide electricity the grid 170 or other load (e.g., one or more batteries). The frames 110 can be integrated into any system that provides three dimensional solar system applications. The one or more modules 105 include a bottom module and one or more upper modules as described herein.

The systems 102 securing a mechanical stacking of the one or more modules 105 to vertically align the plurality of solar cells and/or transmissive solar cells of the one or more modules 105. Each of the one or more modules 105 of the environment 100 can further include one or more solar cell arrangements. For example, the module 105 includes one or more cells arranged in an x-y grid, where both x and y are integers greater than 0 or where x is 1 and y is an integer greater than 0. The width, wiring, configuration of cells can be managed and operated to control power generation on a per cell basis.

According to one or more technical effects, advantages, and benefits, the frame 110 enable the solar modules 105 to be easily moved, replaced, and/or exchanged, such as for future generation modules 105. The frame 110 stacks the solar modules 105 vertically to maximize a solar energy captured per square meter of surface area. Further, a vertical aspect of ordering the solar modules 105 within the frame 110 enables capturing each bandgap, cooling, spacing, etc. According to one or more embodiments, the frame 110 can utilize a shell or casing that holds multiple solar modules placed on top of another, with the interim section 130 therebetween allowing for airflow for cooling or without a space. Note that, in an example of FIG. 1, the frame 110 stacks four layers of modules 105, where each module 105 corresponds to one of the strings 120. Each string 120 corresponds and electrically connects to one of the modules 105 to receive the electricity therefrom. Each string 120 is electrically distinct from other strings 120.

According to one or more embodiments, the environment 100 can also include a uniform design, where the solar modules 105 are connected in series or parallel. For example, each cell of the module 105 can provide 1.5 volts. Further, 32 cells can be connected in series within each module 105 that are further connected in series per string 120 (e.g., 18 modules 105 in series per string 120 provides 864 volts). The inverters 115 can combine 32 strings 120 in parallel to produce a high current that is provided to the grid 170. According to one or more embodiments, the environment 100 can also include a tiered design, where the solar modules 105 of the one or more strings 120 are connected in parallel, the solar modules 105 of the one or more strings 120 are connected in series, and/or a combination thereof (e.g., a collection of tiers managed in a hybrid environment).

The system 102 can be a pre-wired modular racking system that incorporates one or more technology aspects (e.g. modular DC optimizers) described herein. According to one or more embodiments, the system 102 can be an aggregation of the one or more frames 110 thereof. A structure of the system 102 can be made of carbon fiber, steel, metal, alloy, wood, plastic, fiberglass, or any combination thereof. According to one or more embodiments, the system 102 can be a "smart rack" system given the plurality of sensors (e.g., the sensors 136, 139, and 140) and an ability to be communicatively coupled to the device 160.

According to one or more technical effects, advantages, and benefits, the frame 110 enables single p-n junction cells (which are cost effective compared to other technologies) to be layered in a stacking structure, along with emulates a tandem cell concept without bonding the solar modules 105 and keeping the electricity distinct. Further, according to one or more technical effects, advantages, and benefit, the frame 110 provides improved modularization that facilitates easy field installation to reduce a balance of plant (BOP) cost structure. For example, solar module prices currently correspond to approximately $0.40 per watt for a utility-scale solar power project cost in the United States of America and include diminishing returns in solar cell cost reductions. Also, BOP cost reductions have made very little progress with conventional solar technologies and have not dropped proportionally as conventional solar technologies advance. Different government agencies target the overall cost threshold for a solar power plant at $0.50 per watt (DC) to be cost-competitive with traditional fossil fuels. This goal is only achievable if there are significant improvements with BOP costs. A way to accomplish this goal is by increasing sunlight capture density per land surface area, thereby decreasing electrical production costs by spreading BOP costs over higher kWh of power production. Further, according to one or more technical effects, advantages, and benefit, the frame 110 is more feasible for homes and commercial buildings where rooftops and property areas are limited. In turn, the frame 110 can make buildings Net Zero electricity consumers and virtually taken off the grid 170. Further, according to one or more technical effects, advantages, and benefit, the environment 100 can salvage infrastructure while having the flexibility to harness future technological improvements (e.g., a solar lifespan averages at 15 years; while in contrast the environment 100 can now extend that lifespan to greater than 50 years).

FIG. 2 depicts a system 200 according to one or more embodiments. The diagram of FIG. 2 is oriented according to an X1-X2 axis and a Y1-Y2 axis. The X1-X2 axis, as represented as a left-right double arrow, is generally oriented horizontally across the page. The Y1-Y2 axis, as represented as an up-down arrow, is generally oriented vertically across the page. The X1 direction is opposite the X2 direction, and the Y1 direction is opposite the Y2 direction. Other orientations can be made in accordance with these axes, which may be tilted or angled. References to a side or a surface of a component can be described in accordance with these axes. For instance, a reference to a lower or bottom side or a downwardly facing surface of a component described may be referred to as a Y1 side or a Y1 surface.

The system 200 receives, from at least a sun 201 (from the Y2 direction), light energy or light 202. The light 202 can be considered incident light or natural light (though other sources are contemplated). The system 100 receives the light 202 at a plurality of solar modules.

According to one or more embodiments, the system 200 includes an optional module 210, with an optional transmissive solar cell 211; a transmissive module 230, with a transmissive solar cell 231; a module 240, with a solar cell 241 that can be optionally transmissive (e.g., the module 240 can be a transmissive module); an optional reflective module 250; one or more boxes 270, and a bus 280. Note that the optionality of any component or any feature is shown with a dotted border. For example, a top solar module (e.g., the optional module 210) can be a concentrator or microconcentrator, one or more middle modules (e.g., the transmissive module 230 and the module 240) can be one or more transmissive modules, and a bottom module can capture any remaining light energy (e.g., infrared radiation) or be reflective (e.g., the reflective module 250).

The optional module 210 can be a concentrator, microconcentrator, or a transmissive module. Each module is connected to the one or more boxes 270, which can be electrical combiner boxes (e.g., corresponding to strings 120 of the frames 110 as described herein) that provide electricity generated by the one or more modules 210, 230, and 240 to the bus 280 (e.g., the PV bus connector and the PV connector box).

The one or more boxes 270 can be hard wired electrical connections that provide outlets, connections, or the like for receiving the one or more modules 210, 230, and 240. Note that the hard wired electrical connections can contain sensors, and the hard wired electrical connections can join wiring from separate modules. For example, each wiring harnesses of a module can protrude to a backside of each outlet to make installation, repairs, and maintenance easy (e.g., in a plug and play fashion). These hard wired electrical connections and outlets can be weatherproof quick connection hardware (e.g., used to connect wires to combiner boxes to simplify installation and reduce field quality errors). Fuses with in-use indication lights can be included with each hard wired electrical connection to ensure the modules are de-energized during installation and maintenance. Additionally, the operations of the system 200 can be monitored by one or more sensors as described herein.

The system 200 is an example of a modular solar system. More particularly, the system 200 is an example of mechanically stacked solar transmissive cells or modular apparatus. According to one or more embodiments, the system 200 includes at least two mechanically stacked modules, such as the optional module 210, the transmissive module 230, and the module 240. According to one or more embodiments, the optional module 210, the transmissive module 230, and the module 240 can be bi-facial (e.g., absorb light energy from either side) and include clear wiring to enable light energy to make multiple passes therethrough. The optional module 210 and the transmissive module 230 can be representative of one or more upper modules. The module 240 can be representative of a module layer, which can be the same or different from the one or more upper modules. The optional module 210 and the transmissive module 230 includes a plurality of transmissive solar cells (e.g., the optional transmissive solar cell 211 and the transmissive solar cell 231), which convert light energy received on a Y2 side (or a sun or first side) into electricity and pass unconverted portions of the light energy to a next module. For instance, the optional module 210 passes in a Y1 direction unconverted portions of the light energy to the transmissive module 230 on a Y2 side (or a sun or second side) of the optional module 210. Further, the transmissive module 230 passes in a Y1 direction unconverted portions of the light energy to the module 240 on a Y2 side (or a sun or second side) of the transmissive module 230.

Note that the module 240 includes a plurality of solar cells (e.g., the solar cell 241 can be optionally transmissive), which convert at least part of the unconverted portions of the light energy into electricity. The system 200 mechanically stacks of the at least two mechanically stacked modules to vertically align the plurality of solar cells of the module 240 with each of the plurality of transmissive solar cells of each of the optional module 210 and the transmissive module 230. In an embodiment, the mechanical stacking by the system 200 can further be sealed on one or more sides, such as by a screen, a water tight membrane, or an air filter as described herein. Example of mechanical stacking includes, but are not limited to, horizontal stacking, parallel stacking with a plane of a horizon (i.e., flat to the earth), and parallel stacking with a plane of a solar array (i.e., design determined). By maintaining cells/modules mechanically and electrically separated, the one or more modules 210, 230, and 240 can be designed to work together for electrical aggregation (e.g., which further enables a broader electrical component scope to achieve power aggregation).

In operation, the sunlight 202 passes through one or more modules 210, 230, and 240. The module 210 can absorb the light 202 at a first wavelength at a first spectral response. Light 291 (i.e., irradiance thereof) that is outside of the first wavelength and in residual excess of the first spectral response outside the first wavelength is further passed in the Y1 direction to the transmissive module 230.

The transmissive module 230 can absorb the light 291 at a second wavelength at a second spectral response. According to one or more embodiments, the first and second wavelengths can be the same. According to one or more embodiments, the first spectral response and the second spectral response can also be the same. Light 293 (i.e., irradiance thereof) that is outside of the second wavelengths and in residual excess of the second spectral response outside the second wavelength is further passed in the Y1 direction to the module 240.

A graph 298 is depicted according to one or more embodiments. The graph 298 is an example spectral response graph of CdTe (e.g., the transmissive solar cell 231 and the transmissive module 230) and c-Si (e.g., the solar cell 241 and the module 240). A key 299 identifies lines within the graph 298. The graph 298 includes an x-axis showing a nanometer scale for wavelength, as well as a left y-axis showing a spectral intensity and a right y-axis showing spectral response, transmittance. Note that the approximate absorption range for the CdTe is 400 to 800 nanometers (e.g., the second wavelength). For example, in the system 200, the transmissive module 230 absorbs irradiance of the light 291 in the 400 to 800 nanometer wavelength range and passes unabsorbed light energy in the wavelength range greater than 800 nanometers.

The module 240 can absorb the light 293 at a third wavelength at a third spectral response. According to one or more embodiments, the third wavelength can include and/or be wider than the second wavelength. Returning to the graph 298, note that the approximate absorption range for the c-Si is 400 to 1200 nanometers (e.g., the second wavelength). The module 240 absorbs irradiance of the light 293 in at least the 800 to 1200 nanometer wavelength range and could pass light energy in the wavelength range greater than 1200nanometers. The module 240 can also absorbs irradiance of the light 293 in the 400 to 1200 nanometer wavelength range, where the 400 to 800 nanometer wavelength range includes the light 293 (i.e., irradiance thereof) that is in residual excess of the second spectral response across the second wavelength. Further, light 295 (i.e., irradiance thereof) that is outside of the third wavelength and in a residual excess of the third spectral response across the third wavelength is further passed in the Y1 direction to the reflective module 250.

The reflective module 250 reflects the light 295 in the Y2 direction back to the module 240. Any remaining irradiance of the light 295 can further be absorbed by the module 240 or passed as light 297 to the transmissive module 230 (e.g., the light 297 continues in the Y2 direction). Next, any remaining irradiance of the light 297 can further be absorbed by the transmissive module 230 or passed as light 299 to the module 210 (e.g., the light 299 continues in the Y2 direction). Note the fading of the arrows representing the light 202, 291, 293, 295, 297, and 299 illustrate the absorption of irradiance and descries of energy, as the light 202 is converted to electricity that is sent to the boxes 270. Note also that each a particular irradiance or portion thereof may not be absorbed on a first pass and may be absorbed on a second pass (i.e., in the Y2 direction).

Figure 3:
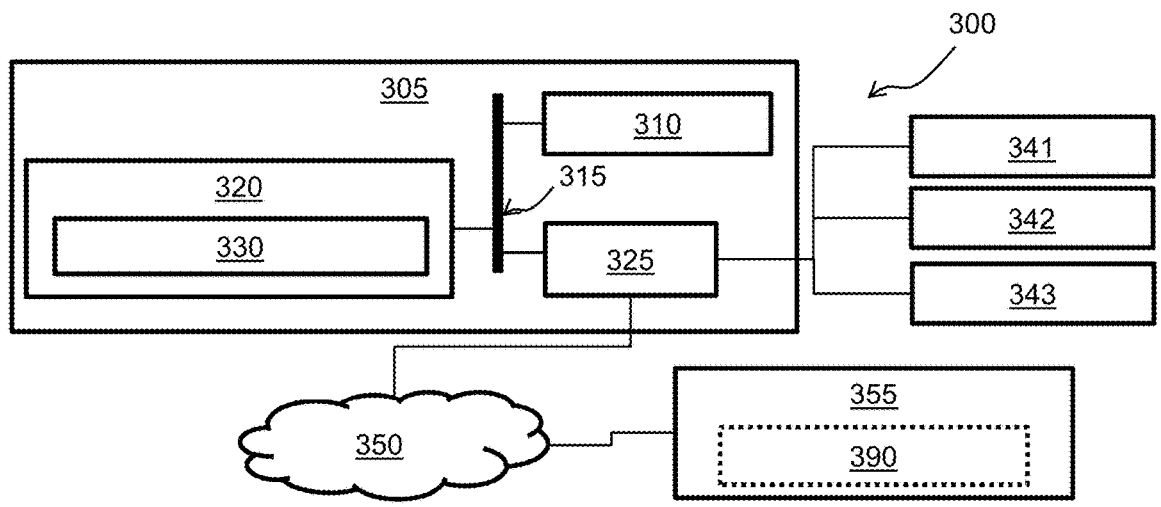
FIG. 3 depicts a system according to one or more embodiments.

Turning now to FIG. 3, a computing system 300 is illustrated according to one or more embodiments. The computing system 300 can be representative of any computing device, computing apparatus, and/or computing environment, which comprise hardware, software, or a combination thereof. Further, embodiments of the computing system 300 disclosed may include apparatuses, systems, methods, and/or computer program products at any possible technical detail level of integration.

The computing system 300 has a computing device 305 (e.g., the device 160 of FIG. 1) with one or more central processing units (CPU(s)), which are collectively or generically referred to as a processor 310. The processor 310, also referred to as processing circuits, is coupled via a system bus 315 to a system memory 320 and various other components. The computing system 300 and/or the device 305 may be adapted or configured to perform as an online platform, a server, an embedded computing system, a personal computer, a console, a personal digital assistant (PDA), a cell phone, a tablet computing device, a quantum computing device, cloud computing device, a mobile device, a smartphone, a fixed mobile device, a smart display, a wearable computer, or the like.

The processor 310 may be any type of general or specific purpose processor, including a central processing unit (CPU), application specific integrated circuit (ASIC), field programmable gate array (FPGA), graphics processing unit (GPU), controller, multi-core processing unit, three dimensional processor, quantum computing device, or any combination thereof. The processor 310 may also have multiple processing cores, and at least some of the cores may be configured to perform specific functions. Multi-parallel processing may also be configured. In addition, at least the processor 310 may be a neuromorphic circuit that includes processing elements that mimic biological neurons.

The bus 315 (or other communication mechanism) is configured for communicating information or data to the processor 310, the system memory 320, and various other components, such as the adapters 325.

The system memory 320 is an example of a (non-transitory) computer readable storage medium, where software 330 can be stored as software components, modules, engines, instructions, or the like for execution by the processor 310 to cause the computing device 305 to operate, such as described herein with reference to FIG. 1. The system memory 320 can include any combination of a read only memory (ROM), a random access memory (RAM), internal or external Flash memory, embedded static-RAM (SRAM), solid-state memory, cache, static storage such as a magnetic or optical disk, or any other types of volatile or non-volatile memory. Non-transitory computer readable storage mediums may be any media that can be accessed by the processor 310 and may include volatile media, non-volatile media, or the like. For example, the ROM is coupled to the system bus 315 and may include a basic input/output system (BIOS), which controls certain basic functions of the computing device 305, and the RAM is read-write memory coupled to the system bus 315 for use by the processors 310. Non-transitory computer readable storage mediums can include any media that is removable, non-removable, or the like.

According to one or more embodiments, the software 330 can be configured in hardware, software, or a hybrid implementation. The software 330 can be composed of modules that are in operative communication with one another, and to pass information or instructions. According to one or more embodiments, the software 330 can provide one or more user interfaces, such as on behalf of the operating system or other application and/or directly as needed. The user interfaces include, but are not limited to, graphic user interfaces, window interfaces, internet browsers, and/or other visual interfaces for applications, operating systems, file folders, and the like. Thus, user activity can include any interaction or manipulation of the user interfaces provided by the software 330. The software 330 can further include custom modules to perform application specific processes or derivatives thereof, such that the computing system 300 may include additional functionality. For example, according to one or more embodiments, the software 330 may be configured to store information, instructions, commands, or data to be executed or processed by the processor 310 to logically implement the methods described herein (e.g., big data operations with respect to machine learning and artificial intelligence). The software 330 of FIG. 3 can also be representative of an operating system, a mobile application, a client application, and/or the like for the computing device 305 for the computing system 300.

Further, modules of the software 330 can be implemented as a hardware circuit comprising custom very large scale integration (VLSI) circuits or gate arrays, off-the-shelf semiconductors such as logic chips, transistors, or other discrete components, in programmable hardware devices (e.g., field programmable gate arrays, programmable array logic, programmable logic devices), graphics processing units, or the like. Modules of the software 330 can be at least partially implemented in software for execution by various types of processors. According to one or more embodiments, an identified unit of executable code may include one or more physical or logical blocks of computer instructions that may, for instance, be organized as an object, procedure, routine, subroutine, or function. Executables of an identified module co-located or stored in different locations such that, when joined logically together, comprise the module. A module of executable code may be a single instruction, one or more data structures, one or more data sets, a plurality of instructions, or the like distributed over several different code segments, among different programs, across several memory devices, or the like. Operational or functional data may be identified and illustrated herein within modules of the software 330, and may be embodied in a suitable form and organized within any suitable type of data structure.

Furthermore, modules of the software 330 can also include, but are not limited to, location modules, augmented reality modules, virtual reality modules, blockchain module, and machine learning and/or an artificial intelligence (ML/AI) algorithm modules. In an example, modules of the software 330 can modulate signaling onto power wires for inter-panel communication and/or provide wireless communication.

A location module can be configured can be configured to create, build, store, and provide algorithms and models that determine a location of the computing device 305 and relative distances. According to more or more embodiments, the location module can implement location, geosocial networking, spatial navigation, satellite orientation, surveying, distance, direction, and/or time software.

An augmented reality module can be configured to create, build, store, and provide algorithms and models that provide interactive experiences of a real-world environments where objects that reside in the real world are enhanced by computer-generated perceptual information, sometimes across multiple sensory modalities. A virtual reality module can be configured to create, build, store, and provide algorithms and models that simulate experiences similar to or completely different from the real world. According to more or more embodiments, the virtual reality and/or the augmented reality modules can provide augmented, mixed, immersive, and/or text-based virtual reality.

A blockchain module can be configured to create, build, store, and provide algorithms and models that provide records or blocks linked together using cryptography, such that each block contains at least one or more of a cryptographic hash of the previous block (e.g., thereby forming a chain), a timestamp, and transaction data (e.g., social data, connection data, preference data, etc.). The timestamp can identify that the transaction data existed when the block was published to get into its hash.

A ML/AI algorithm module can be configured to create, build, store, and provide algorithms and models that improve automatically through experience, as well as emulate 'natural' cognitive abilities of humans. In an example, ML software uses training data to build a particular model and to improve that model, while artificial intelligence software perceives an environment (e.g., receives active data) and takes actions (e.g., applies a model) to solve a problem and/or produce an output. AI software can use a model built by humans and/or ML software. AI software can further provide feedback to the ML software to improve any models thereof. ML/AI can exist independently and/or coexist.

With respect to the adapter 325 of FIG. 3, the computing device 305 can particularly include an input/output (I/O) adapter, a device adapter, and/or a communications adapter. According to one or more embodiments, the I/O adapter can be configured as a small computer system interface (SCSI), of in view of frequency division multiple access (FDMA) single carrier FDMA (SC-FDMA), time division multiple access (TDMA), code division multiple access (CDMA), orthogonal frequency-division multiplexing (OFDM), orthogonal frequency-division multiple access (OFDMA), global system for mobile (GSM) communications, general packet radio service (GPRS), universal mobile telecommunications system (UMTS), cdma2000, wideband CDMA (W-CDMA), high-speed downlink packet access (HSDPA), high-speed uplink packet access (HSUPA), high-speed packet access (HSPA), long term evolution (LTE), LTE Advanced (LTE-A), 802.11x, Wi-Fi, Zigbee, Ultra-Wide-Band (UWB), 802.16x, 802.15, home Node-B (HnB), Bluetooth, radio frequency identification (RFID), infrared data association (IrDA), near-field communications (NFC), fifth generation (5G), new radio (NR), or any other wireless or wired device/transceiver for communication. The device adapter interconnects input/output devices to the system bus 315, such as a display 341, a sensor 342, a controller 343, or the like (e.g., a camera, a speaker, etc.).

The communications adapter interconnects the system bus 315 with a network 350, which may be an outside network, enabling the computing device 305 to communicate data with other such devices (e.g., such a computing system 355 through the network 350). In one embodiment, the adapter 325 may be connected to one or more I/O buses that are connected to the system bus 315 via an intermediate bus bridge. Suitable I/O buses for connecting peripheral devices such as hard disk controllers, network adapters, and graphics adapters typically include common protocols, such as the Peripheral Component Interconnect (PCI).

The display 341 is configured to provide one or more UIs or graphic UIs (GUIs) that can be captured by and analyzes by the software 330, as the users interacts with the computing device 305. Examples of the display 341 can include, but are not limited to, a plasma, a liquid crystal display (LCD), a light emitting diode (LED), a field emission display (FED), an organic light emitting diode (OLED) display, a flexible OLED display, a flexible substrate display, a projection display, a 4K display, a high definition (HD) display, a Retina© display, an in-plane switching (IPS) display or the like. The display 341 may be configured as a touch, three dimensional (3D) touch, multi-input touch, or multi-touch display using resistive, capacitive, surface-acoustic wave (SAW) capacitive, infrared, optical imaging, dispersive signal technology, acoustic pulse recognition, frustrated total internal reflection, or the like as understood by one of ordinary skill in the art for input/output (I/O).

The sensor 342, such as any transducer configured to convert one or more environmental conditions into an electrical signal, may be further coupled to the system bus 315 for input to the computing device 305. For example, the sensor 342 can generate parameter data based on detecting voltages, temperatures, and currents. Further, the sensor 342 can generate the parameter data based on detecting solar irradiation, wind, and ambient temperature, as well as other environmental and electrical attributes of the racking frame (e.g., the frame 110) or an individual module (e.g., the frame 105).

In addition, one or more inputs may be provided to the computing system 300 remotely via another computing system (e.g., the computing system 355) in communication therewith, or the computing device 305 may operate autonomously. For example, the sensor 342 can include one or more of an electrode, a temperature sensor (e.g., thermocouple), a current sensor, a photosensor, an accelerometer, a microphone, a radiation sensor, a proximity sensor, position sensor, and a long range (LoRa) sensor (e.g., any low-power wide-area network modulation sensor).

According to one or more embodiments, the sensors 342 can be installed at each level and integrated into an environment (e.g., the environment 100 of FIG. 1) to monitor operations therein, such as identify when a specific solar panel is not functioning correctly. For example. when a panel's electric current falls below a defined threshold, the sensors 342 (e.g., electric current sensors) send a signal to the software 330 to identify a malfunctioning module's exact location. Each sensor 342 comprises a serial number that can be matched with each panel/cartridge/truss/etc.

(e.g., as identified on a scannable code) and corresponding level of the environment (e.g., the environment 100 of FIG. 1).

The controller 343, such as a computer mouse, a touchpad, a touch screen, a keyboard, a keypad, or the like, may be further coupled to the system bus 315 for input to the computing device 305. In addition, one or more inputs may be provided to the computing system 300 remotely via another computing system (e.g., the computing system 355) in communication therewith, or the computing device 305 may operate autonomously. The controller 343 can also be representative of one or more actuators or the like for moving, locking, unlocking portions of the environment (e.g., the environment 100 of FIG. 1).

According to one or more embodiments, the functionality of the computing device 305 with respect to the software 330 can also be implemented on the computing system 355, as represented by separate instances of the software 390. Note that the software 390 can be stored in a common repository located at the computing device 305 and/or the computing system 355 and can be downloaded (on demand) to and/or from each of the computing device 305 and/or the computing system 355. Thus, the functionality of the computing device 305 and the computing system 355 can includes ML/AI, power production management, power predictions, power forecasting, power fault tolerance, etc.

According to one or more embodiments, the computing system 355 can be a server, a database, and/or cloud device. The computing system 355 can collect and analyze the operations of any system (e.g., the environment 100 of FIG. 1) and/or the parameter data. For example, the computing system 355 a distributed cloud based implementation enabling big data processing of the operations of any system (e.g., the environment 100 of FIG. 1) and/or the parameter data. According to one or more technical effects, advantages, and benefits, because each sensor 342 can be pre-wired and/or include positioning (i.e., GPS) technologies, the computing device 305 and/or the computing system 355 can leverage the big data processing to determine locations of exactly where problems occur (i.e., in contrast to conventional hub and spoke dumb transmitters designs) and determine remedial actions. According to one or more embodiments, the computing device 305 and/or the computing system 355 can determine a degradation or suboptimal performance of any module (e.g., of the one or more modules 210, 230, and 240) by analyzing the operations of the intelligent solar racking system and the parameter data. According to one or more embodiments, the computing device 305 and/or the computing system 355 can determine long term trends of the intelligent solar racking system by analyzing the operations of any system (e.g., the environment 100 of FIG. 1) and/or the parameter data. According to one or more embodiments, the computing device 305 and/or the computing system 355 can generate automatic feedback to the opposite device/system 305/355 to optimize or reconfigure an electrical operation of any system (e.g., the environment 100 of FIG. 1) by bypassing or isolating any module (e.g., of the one or more modules 210, 230, and 240) or by adjusting voltage levels or current levels. The computing system 355 generates feedback to third-party intelligent systems (e.g., drones, cleaners, robots, scheduling systems, maintenance personnel, etc.) to take actions (e.g., module cleaning, module replacement) that optimize an electrical output of any system (e.g., the environment 100 of FIG. 1).

Figure 4:
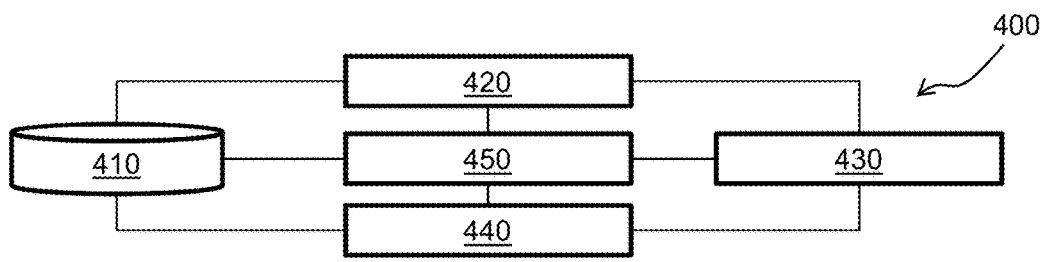
FIG. 4 depicts a system according to one or more embodiments.
Figure 5:
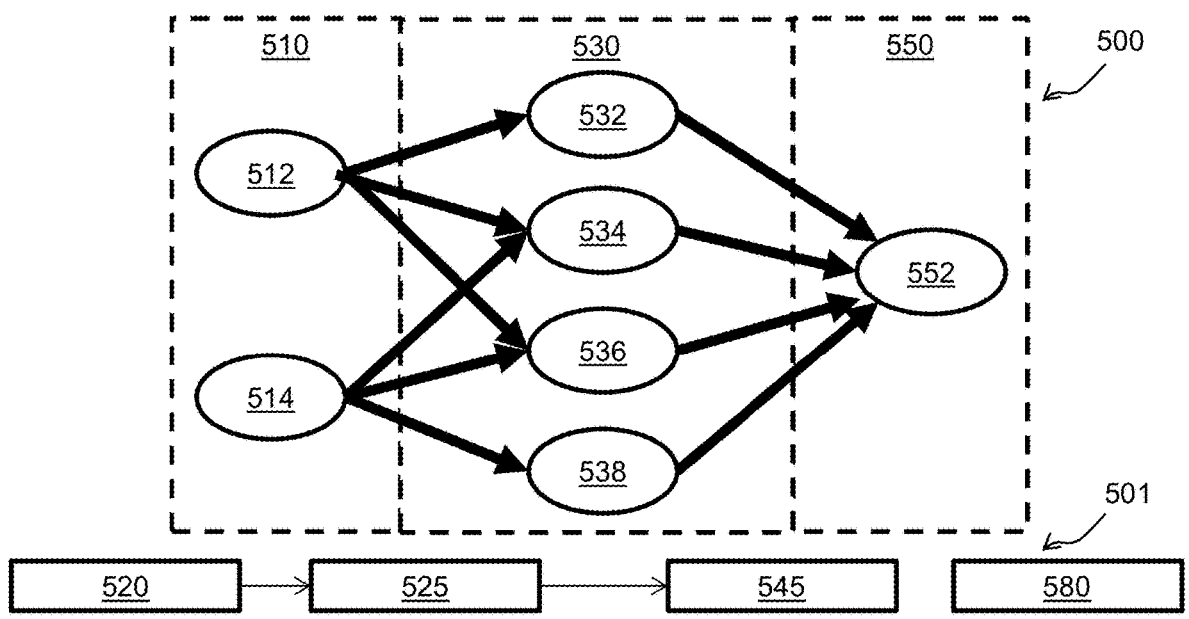
FIG. 5 depicts a neural network and a method according to one or more embodiments.

According to one or more embodiments, the software 330 utilizes ML/AI algorithm module therein, as described with respect to FIGS. 4-5. As indicated herein, the description of FIGS. 4-5 is made with reference to FIG. 3 for ease of understanding where appropriate.

FIG. 4 illustrates a graphical depiction of an artificial intelligence system 400 according to one or more embodiments. The artificial intelligence system 400 includes data 410, a machine 420, a model 430, an outcome 440, and (underlying) hardware 450. The description of FIG. 4 is made with reference to FIG. 3 for ease of understanding where appropriate. For example, the machine 420, the model 430, and the hardware 450 can represent aspects of the software 330 of FIG. 3 (e.g., ML/AI algorithm module therein), while the hardware 450 can also represent the computing device 305 of FIG. 3. In general, the machine learning and/or the artificial intelligence algorithms of the artificial intelligence system 400 (e.g., as implemented by the software 330 of FIG. 3) operate with respect to the hardware 450, using the data 410, to train the machine 420, build the model 430, and predict the outcomes 440.

For instance, the machine 420 operates as the controller or data collection associated with the hardware 450 and/or is associated therewith. The data 410 can be on-going data or output data associated with the hardware 450. The data 410 can also include currently collected data, historical data, or other data from the hardware 450 and can be related to the hardware 450. The data 410 can be divided by the machine 420 into one or more subsets. As an example, the data 410 can be one or more of temperature, current, light, motion, sound, radiation, proximity sensor, and/or position data, as well as historical data, data from other environments, data from other systems (e.g., weather data).

Further, the machine 420 trains, such as with respect to the hardware 450. This training can also include an analysis and correlation of the data 410 collected. In accordance with another embodiment, training the machine 420 can include self-training by the software 330 of FIG. 3 utilizing the one or more subsets. In this regard, the software 330 of FIG. 3 learns to detect and predict data from the data 410 (e.g., predictive comparative weather operations).

Moreover, the model 430 is built on the data 410 associated with the hardware 450. Building the model 430 can include physical hardware or software modeling, algorithmic modeling, and/or the like that seeks to represent the data 410 (or subsets thereof) that has been collected and trained. In some aspects, building of the model 430 is part of self-training operations by the machine 420. The model 430 can be configured to model the operation of hardware 450 and model the data 410 collected from the hardware 450 to predict the outcome 440 achieved by the hardware 450. Predicting the outcomes 440 (of the model 430 associated with the hardware 450) can utilize a trained model 430. Thus, using the outcome 440 that is predicted, the machine 420, the model 430, and the hardware 450 can be configured accordingly.

Thus, for the artificial intelligence system 400 to operate with respect to the hardware 450, using the data 410, to train the machine 420, build the model 430, and predict the outcomes 440, the machine learning and/or the artificial intelligence algorithms therein can include neural networks. In general, a neural network is a network or circuit of neurons, or in a modern sense, an artificial neural network (ANN), composed of artificial neurons or nodes or cells.

For example, an ANN involves a network of processing elements (artificial neurons) which can exhibit complex global behavior, determined by the connections between the processing elements and element parameters. These connections of the network or circuit of neurons are modeled as weights. A positive weight reflects an excitatory connection, while negative values mean inhibitory connections. Inputs are modified by a weight and summed using a linear combination. An activation function may control the amplitude of the output. For example, an acceptable range of output is usually between 0 and 1, or it could be −1 and 1. In most cases, the ANN is an adaptive system that changes its structure based on external or internal information that flows through the network.

In more practical terms, neural networks are non-linear statistical data modeling or decision-making tools that can be used to model complex relationships between inputs and outputs or to find patterns in data. Thus, ANNs may be used for predictive modeling and adaptive control applications, while being trained via a dataset. Note that self-learning resulting from experience can occur within ANNs, which can derive conclusions from a complex and seemingly unrelated set of information. The utility of artificial neural network models lies in the fact that they can be used to infer a function from observations and also to use it. Unsupervised neural networks can also be used to learn representations of the input that capture the salient characteristics of the input distribution, and more recently, deep learning algorithms, which can implicitly learn the distribution function of the observed data. Learning in neural networks is particularly useful in applications where the complexity of the data or task makes the design of such functions by hand impractical.

Neural networks can be used in different fields. Thus, for the artificial intelligence system 400, the machine learning and/or the artificial intelligence algorithms therein can include neural networks that are divided generally according to tasks to which they are applied. These divisions tend to fall within the following categories: regression analysis (e.g., function approximation) including time series prediction and modeling; classification including pattern and sequence recognition; novelty detection and sequential decision making; data processing including filtering; clustering; blind signal separation, and compression. For example, application areas of ANNs include nonlinear system identification and control (vehicle control, process control), game-playing and decision making (backgammon, chess, racing), pattern recognition (radar systems, face identification, object recognition), sequence recognition (gesture, speech, handwritten text recognition), financial applications, data mining (or knowledge discovery in databases, "KDD"), visualization and e-mail spam filtering.

According to one or more embodiments, the neural network can implement a long short-term memory neural network architecture, a convolutional neural network (CNN) architecture, or other the like. The neural network can be configurable with respect to a number of layers, a number of connections (e.g., encoder/decoder connections), a regularization technique (e.g., dropout); and an optimization feature.

The long short-term memory neural network architecture includes feedback connections and can process single data points (e.g., such as images), along with entire sequences of data (e.g., such as speech or video). A unit of the long short-term memory neural network architecture can be composed of a cell, an input gate, an output gate, and a forget gate, where the cell remembers values over arbitrary time intervals and the gates regulate a flow of information into and out of the cell.

The CNN architecture is a shared-weight architecture with translation invariance characteristics where each neuron in one layer is connected to all neurons in the next layer. The regularization technique of the CNN architecture can take advantage of the hierarchical pattern in data and assemble more complex patterns using smaller and simpler patterns. If the neural network implements the CNN architecture, other configurable aspects of the architecture can include a number of filters at each stage, kernel size, a number of kernels per layer.

Turning now to FIG. 5, an example of a neural network 500 and a block diagram of a method 501 performed in the neural network 500 are shown according to one or more embodiments. The neural network 500 operates to support implementation of the machine learning and/or the artificial intelligence algorithms (e.g., as implemented by the software 330 of FIG. 3) described herein. The neural network 500 can be implemented in hardware, such as the machine 420 and/or the hardware 450 of FIG. 4.

In an example operation, the software 330 of FIG. 3 includes collecting the data 410 from the hardware 450. In the neural network 500, an input layer 510 is represented by a plurality of inputs (e.g., inputs 512 and 514 of FIG. 5). With respect to block 520 of the method 501, the input layer 510 receives the inputs 512 and 514.

At block 525 of the method 501, the neural network 500 encodes the inputs 512 and 514 utilizing any portion of the data 410 (e.g., the dataset and predictions produced by the artificial intelligence system 400) to produce a latent representation or data coding. The latent representation includes one or more intermediary data representations derived from the plurality of inputs. According to one or more embodiments, the latent representation is generated by an element-wise activation function (e.g., a sigmoid function or a rectified linear unit) of the software 330 of FIG. 3. As shown in FIG. 5, the inputs 512 and 514 are provided to a hidden layer 530 depicted as including nodes 532, 534, 536, and 538. The neural network 500 performs the processing via the hidden layer 530 of the nodes 532, 534, 536, and 538 to exhibit complex global behavior, determined by the connections between the processing elements and element parameters. Thus, the transition between layers 510 and 530 can be considered an encoder stage that takes the inputs 512 and 514 and transfers it to a deep neural network (within layer 530) to learn some smaller representation of the input (e.g., a resulting the latent representation).

The deep neural network can be a CNN, a long short-term memory neural network, a fully connected neural network, or combination thereof. This encoding provides a dimensionality reduction of the inputs 512 and 514. Dimensionality reduction is a process of reducing the number of random variables (of the inputs 512 and 514) under consideration by obtaining a set of principal variables. For instance, dimensionality reduction can be a feature extraction that transforms data (e.g., the inputs 512 and 514) from a high-dimensional space (e.g., more than 10 dimensions) to a lower-dimensional space (e.g., 2-3 dimensions). The technical effects and benefits of dimensionality reduction include reducing time and storage space requirements for the data 410, improving visualization of the data 410, and improving parameter interpretation for machine learning. This data transformation can be linear or nonlinear. The operations of receiving (block 520) and encoding (block 525) can be considered a data preparation portion of the multi-step data manipulation by the software 330.

At block 545 of the method 501, the neural network 500 decodes the latent representation. The decoding stage takes the encoder output (e.g., the resulting the latent representation) and attempts to reconstruct some form of the inputs 512 and 514 using another deep neural network. In this regard, the nodes 532, 534, 536, and 538 are combined to produce in the output layer 550 an output 552, as shown in block 580 of the method 510. That is, the output layer 550 reconstructs the inputs 512 and 514 on a reduced dimension but without the signal interferences, signal artifacts, and signal noise.

Figure 6:
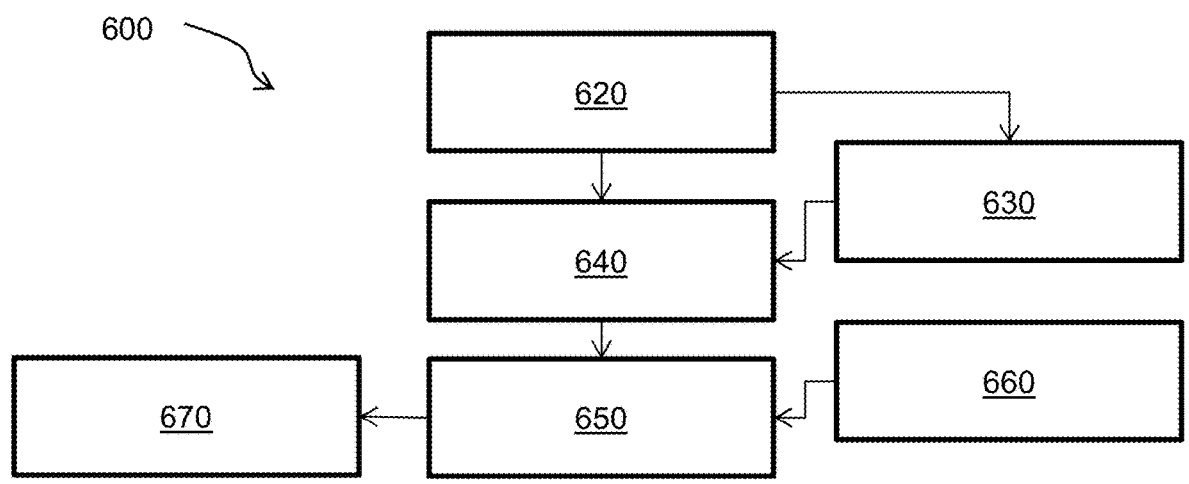
FIG. 6 depicts a method according to one or more embodiments.

Turning now to FIG. 6, a method 600 (e.g., performed by the software 330 of FIG. 3) is illustrated according to one or more exemplary embodiments. The method 600 determines and monitors operations of the intelligent solar racking system, as well as provides a panel off-line location sensor and software alert system provides a panel off-line location sensor and software alert system.

The method 600 begins at block 620, where the software 330 monitors the environment 100. In this regard, the software 330 receives one or more inputs (e.g., the output signals of the sensors 136, 139, and 140). For example, the one or more inputs can be the parameter data provided by the one or more sensors 342, the computing system 355, and/or through other sources provided in real time or otherwise. According to one or more embodiments, the parameter data can include one or more of temperature, current, light, motion, sound, radiation, proximity sensor, and/or position data, as well as historical data, data from other environments, data from other systems (e.g., weather data, irradiation data).

At block 630, the software 330 records the one or more inputs. The software 330 can record the one or more inputs, as the parameter data, in conjunction with real-time timestamps at the computing device 305 and/or the computing system 355. The recorded inputs can be accumulated over time, as well as aggregated with inputs from other systems.

At block 640, the software 330 identifies the one or more inputs. Identifying the one or more inputs can be related to matching serial numbers and/or positions of the sensors 342 with the parameter data of the systems. Note that the operations of blocks 630 and 640 can occur in a loop, operation in parallel, and operate independently.

According to one or more embodiments, after installation of a modular solar system, a maintenance service provider or a technician can scan (using a mobile device connected to the computing system 355) each code 138 on each module 105, which provides (as data) an exact geo-position of each module 105 (e.g., input data) into a database or repository of the computing system 355. When a module 104 fails to produce an electric design current, the sensor 342 that corresponds to the exact geo-position sends a signal to the software 330 (e.g., input data).

Figure 7:
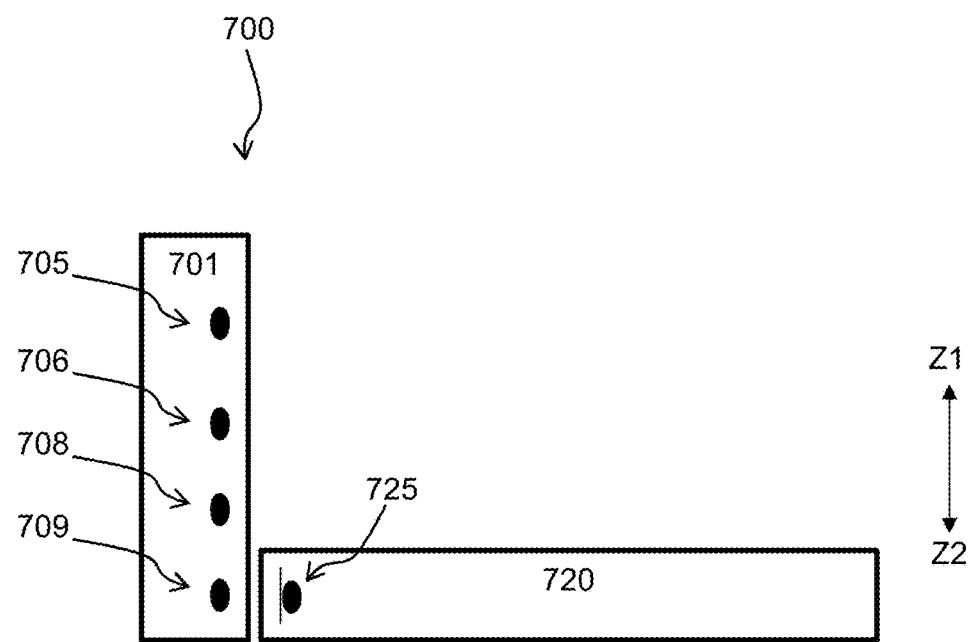
FIG. 7 depicts a detection example according to one or more embodiments.

According to one or more embodiments, the sensors 139 can be preset with positions (e.g., an x, y, z positions) within the frames 110 and the systems 102. Further, at the time of installation, distances can be determined from the device 160 for the sensors 139 and with respect to a geo-location. In some cases, the sensors 139 can include GPS technology and work in conjunction with other components of the system 102 to determine the exact geo-position of each sensor. Thus, upon insertion of any module 105 (whether intelligent or conventional), the sensors 139 are positioned to associate with each of the modules 105. Turning to FIG. 7, a detection example 700 is depicted according to one or more embodiments.

The detection example 700 shows a frame 701 including a plurality of sensors 705, 706, 708, and 709. Each of the plurality of sensors 705, 706, 708, and 709 is positioned at a specific height of the frame 701 (i.e., along a Z1-Z2 axis). Thus, each sensor 705, 706, 708, and 709 can detect at least a module presence as the data parameter for a module 720 including a sensor 725. Additionally or alternatively, the device 160 can detect a connection of the module 720 to a receptacle in a position along a Z1-Z2 axis (e.g., corresponding connectors 985 of FIG. 9, a pre-wired receptacle, a pin connection, a pig tail connection, or the like).

Returning to FIG. 6, at block 650, the software 330 performs analysis of all input data (e.g., analyze the output signals to determine and monitor operations of the intelligent solar racking system). For example, by utilizing the output signals of the sensors 705, 706, 708, and 709 respective to a particular module, the software inherently knows that the information provided is relative to a particular portion of the frame 701. According to one or more technical effects, advantages, and benefits, because each sensor 342 can be pre-wired and/or include positioning (i.e., GPS) technologies, the computing device 305 and/or the computing system 355 can leverage the big data processing to determine locations of exactly where problems occur (i.e., in contrast to conventional hub and spoke dumb transmitters designs) and determine remedial actions. Additionally, the software 330 can operate big data and ML/AI analysis, which can further make determinations respective to heat, energy conversion, energy use, need for cleaning, need for moving modules 105, etc. Thus, the software 330 reconciles operations of the intelligent solar racking system, by performing a cross data/module analysis.

At block 660, the software 330 receives external data. The external data can include, but is not limited to weather data, weather forecasts, solar irradiation data, solar flare data, solar irradiation forecasts, wind data, electrical grid data, real-time weather information, historical data, data from other environments, data from other systems etc. The computing system 355 can collect and analyze the operations of any system (e.g., the environment 100 of FIG. 1), the parameter data, and/or the external data. According to one or more embodiments, the computing system 355 a distributed cloud based implementation enabling big data processing of the operations of any system (e.g., the environment 100 of FIG. 1), the parameter data, and/or the external data. According to one or more embodiments, the computing device 305 and/or the computing system 355 can determine a degradation or suboptimal performance of any module (e.g., of the one or more modules 210, 230, and 240) by analyzing the operations of the intelligent solar racking system, the parameter data, and/or the external data. According to one or more embodiments, the computing device 305 and/or the computing system 355 can determine long term trends of the intelligent solar racking system by analyzing the operations of any system (e.g., the environment 100 of FIG. 1), the parameter data, and/or the external data. Additionally, for example, by detecting electrical operations of a module, in combination with light above the frame 110 and light below the frame 110 using photosensors, the software 330 can determine expected efficiencies to further determine whether a module 105 is malfunctioning by the panel.

At block 670, the software 330 initiates actions. According to one or more embodiments, the software 330 can generate automatic feedback to the computing system 355 to optimize or reconfigure an electrical operation of any system (e.g., the environment 100 of FIG. 1) by bypassing or isolating any module (e.g., of the one or more modules 210, 230, and 240 of FIG. 2) or by adjusting voltage levels or current levels. By way of example, the software 330 enables one or more implementations of the actions, such as automatic repairs, powering on/off, and/or cleaning.

According to one or more embodiments, the software 330 can generate feedback to third-party intelligent systems (e.g., drones, cleaners, robots, scheduling systems, maintenance personnel, etc.) to take actions (e.g., module cleaning, module replacement) that optimize an electrical output of any system (e.g., the environment 100 of FIG. 1). For instance, the software 330 can send one or more messages to a technical to perform a repair determined at block 650 (e.g., the software 330 can generate and provide a notification immediately to an operations and maintenance service provider or the like). Then, after one or more repairs are complete, the software 330 sends one or more messages, which confirm the repairs and log any information into a historical report.

According to one or more embodiments, the software 330 can perform real-time reconfigurations of a solar array based on the parameter data, current weather, etc. and optimize electrical output. For instance, as shade progresses across the array, the software 330 can dynamically configure the solar array by taking module offline (as the electrical output would be better with an offline module, then a low efficiency module). Also, the software 330 can dispatch maintenance service provider on cloudy days based on current weather and/or weather forecasts.

Figure 8:
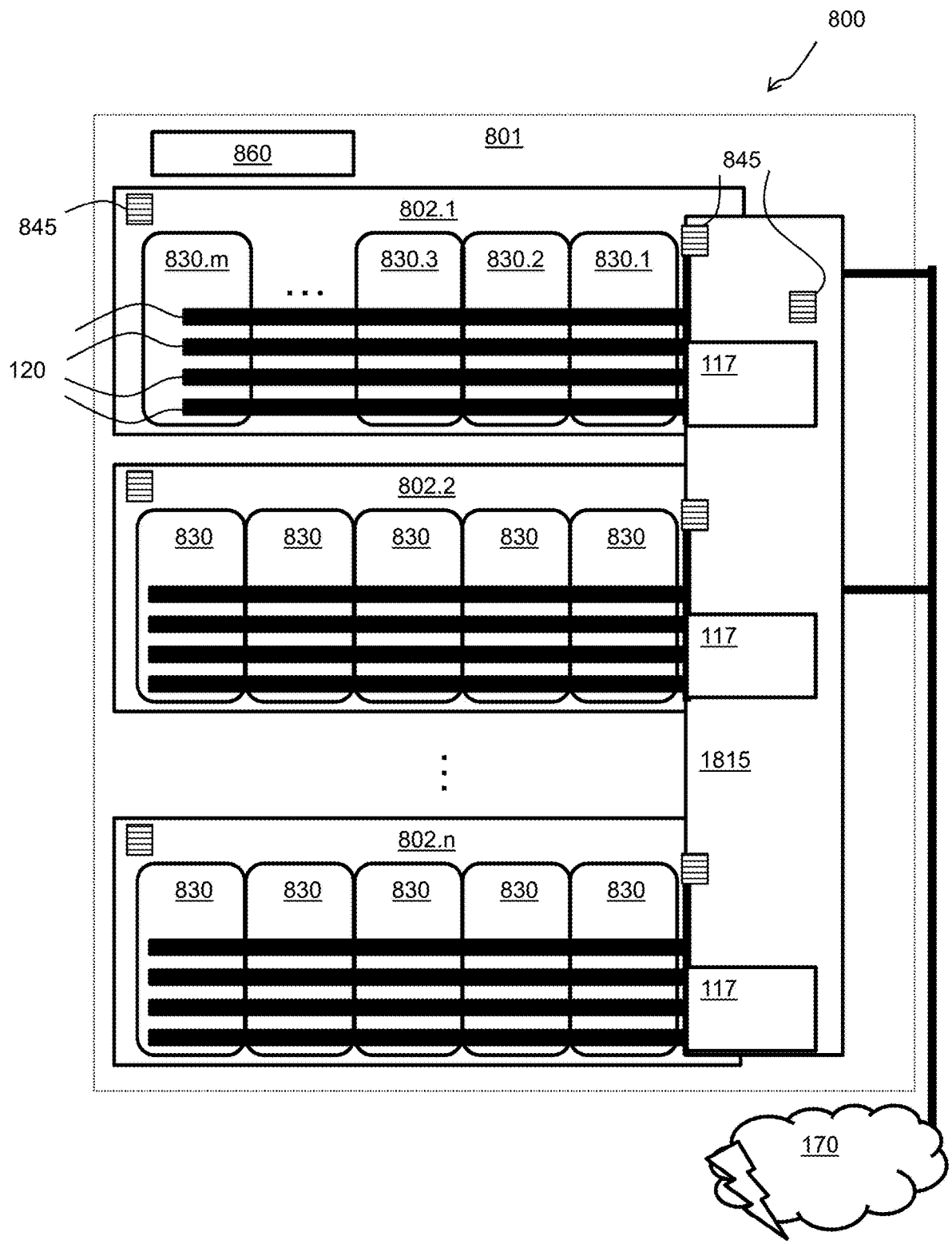
FIG. 8 depicts an environment according to one or more embodiments.

Turning now to FIG. 8, an environment 800 is illustrated according to one or more embodiments. Note that, by way of example in conjunction with the other drawings, like reference numerals in the figures indicate like elements and will not be reintroduced for brevity.

The environment 800 can include one or more modular solar systems as discussed herein. More particularly, the environment 800 can include one or more mechanically stacked solar transmissive modules within one or more apparatuses to receive light (e.g., from at least the sun 201, though other sources are contemplated). In this way, embodiments of the environment 800 include apparatuses, systems, methods, and/or computer program products at any possible technical detail level of integration.

According to one or more embodiments, the environment 800 can be representative of the modular solar system located within the field 801 and including one or more support structures 802.n (where n is an integer). The field 801 can be any terrain or expanse of open or cleared ground for supporting the one or more support structures 802.n, as well as rooftops and/or other property areas. Each support structure 802 can be considered a system, a framework, and a stacking structure.

Each support structures 802 includes at least a combiner 1815, a switch 117, a string 120, and the one or more frames 830 (where m is an integer). Each support structures 802 can include the one or more modules 105 (e.g., the modules 210, 230, and 240 of FIG. 2). Each frame 830 can electrically connect each of the modules 105 upon that solar module being inserted into racking frame 110

One or more sensors 1845 can be located through the support structure 802 and the environment 800. The environment 800 and elements therein (e.g., any of the sensors 845) can be managed by a device 860 (e.g., the computing device 305, ARM processor or the like). Further, the environment 800 can be connected to a grid 170. Generally, the environment 800 is a system of support structures 802 that hold the frames 830 in the field 801 with the sensors 845. The environment 800 illustrates, on a macro level, how elements and things are connected within a greater network for alerts, as well as to provide electricity to the grid 870. One or more embodiments of the environment 800 can also include a uniform design, where modules are connected in series or parallel.

Figure 9:
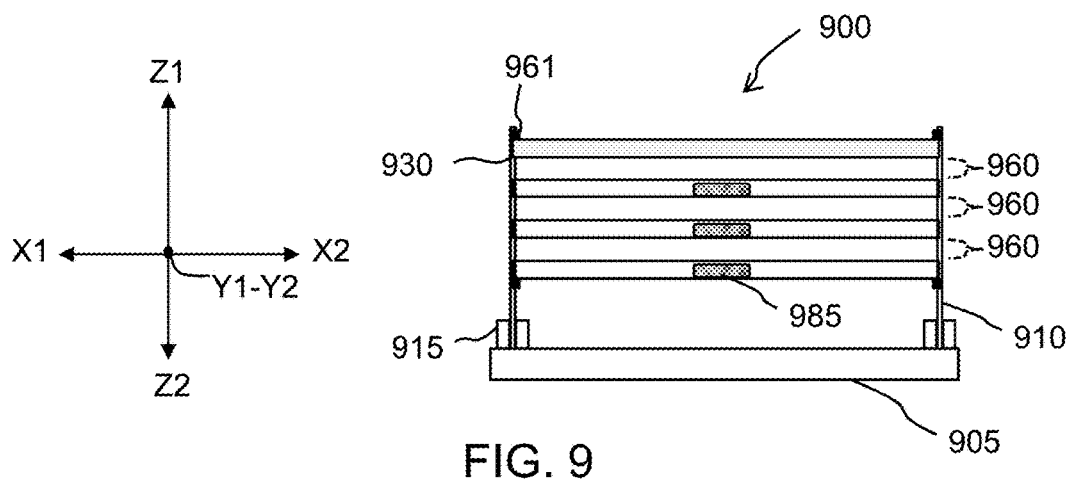
FIG. 9 depicts a diagram of a frame according to one or more embodiments.

FIG. 9 depicts a diagram 900 of a frame 905 according to one or more embodiments. In this regard, the diagram 900 shows that the frame 905 includes arms 910 and one or more holders for the arms 910. A module 930 has been inserted into a top or Z1 position. Further, as no modules are in the remaining positions of the frame 910, corresponding connectors 985 (e.g., via a pre-wired receptacle, a pin connection, a pig tail connection, or the like) that electrically couple any modules adapted to that position within the frame 910 are shown.

Figure 10:
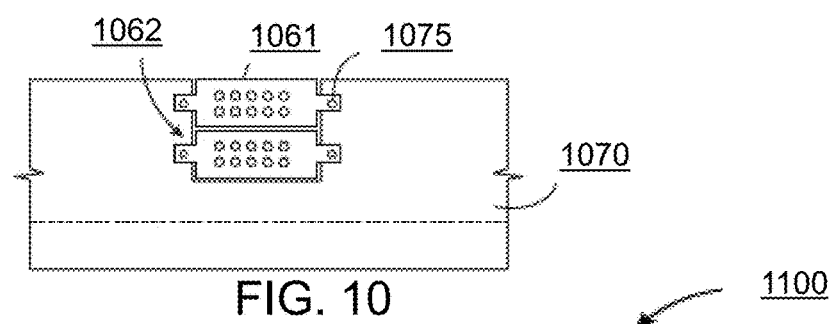
FIG. 10 depicts electrical snap-in power sensors according to one or more embodiments.

According to one or more embodiments, the connector 985 includes hard wired electrical connections, such as combiner box connections that provide outlets, PCI connections, or the like for receiving modules. FIG. 10 depicts electrical snap-in power sensors 1161 and 1162 according to one or more embodiments. The electrical snap-in power sensors 1161 and 1162 can be considered examples of the connector 985 of FIG. 9. The electrical snap-in power sensors 1161 and 1162 can be positioned on a flat stock 1170 and include corresponding fasteners 1175. Note that the hard wired electrical connections can contain sensors (e.g., the sensors 342 of FIG. 3), and the hard wired electrical connections can join wiring from separate modules. For example, a wiring harnesses of the module 930 can protrude to the connector 985 to make installation, repairs, and maintenance easy (e.g., in a plug and play fashion). These hard wired electrical connections and outlets can be weatherproof quick connection hardware (e.g., used to connect wires to combiner boxes or one or more boxes 270 of FIG. 2 to simplify installation and reduce field quality errors). Fuses with in-use indication lights can be included with each hard wired electrical connection to ensure the modules are de-energized during installation and maintenance.

Figure 11:
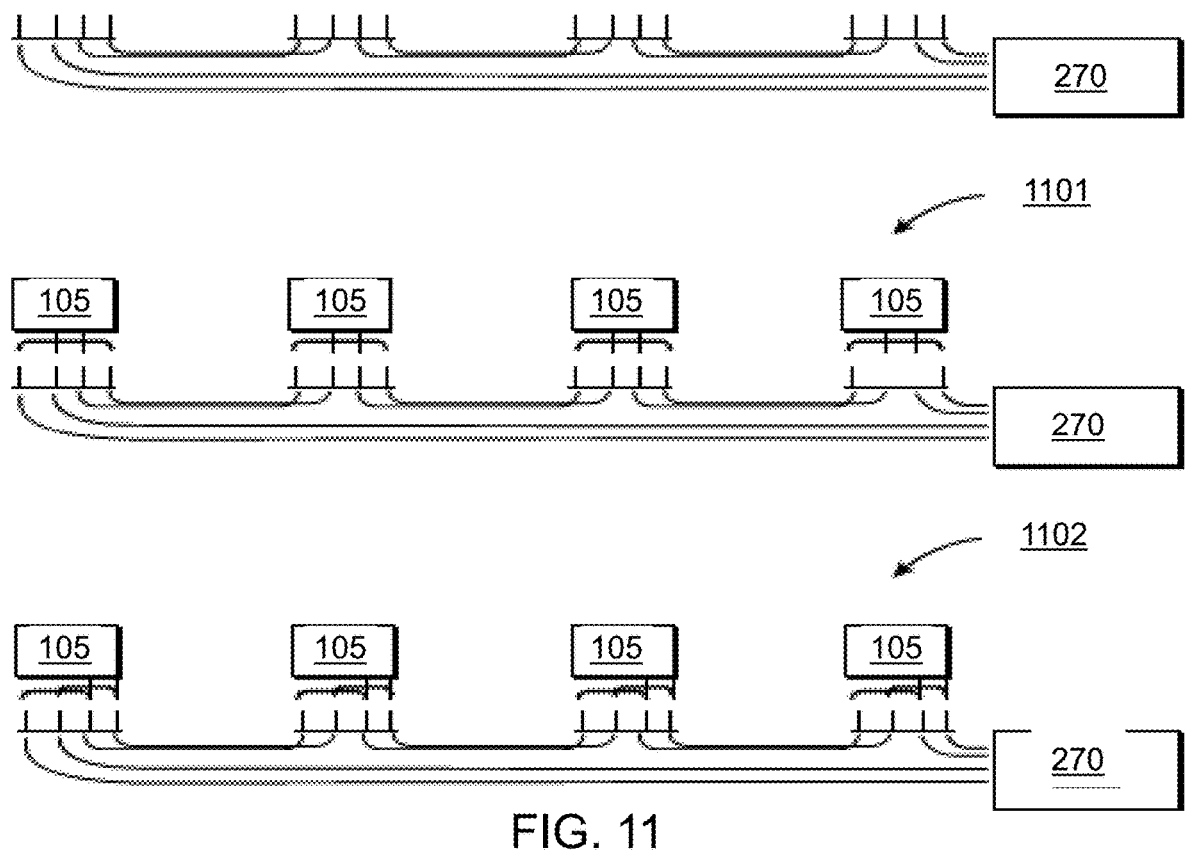
FIG. 11 depicts wiring diagrams a solar module racking system for solar power generation according to one or more embodiments.

FIG. 11 depicts prefabricated wiring examples 1101, 1102, and 1103 according to one or more embodiments. The wiring diagram 1101 illustrates a frame and module wiring (e.g., the string 120 of FIGS. 1 and 8) that enables each module on a tier to be wired in serial or parallel. The wiring diagram 1102 illustrates a serial wiring, while the wiring diagram 1103 illustrates a parallel wiring. As shown, the wiring diagram 1101 includes a 4 pin connector (e.g., the connector 985 of FIG. 9) for each module as a base frame wiring. According to one or more embodiments, by using a 4 pin connector, any appropriate serial/parallel wiring can be put in the module itself, effectively reconfiguring from a parallel to serial wiring (or vice versa). For example, if one tier is perovskite, then each module for that that tier can be configured to be wired in parallel. Further, if another tier is crystalline silicon (c-Si), then that tier can be configured in serial. In turn, the appropriate wiring configuration can be completed in the modules of that tier at the time of manufacture, ensuring each tier is always correctly wired. Additionally, based on the wiring, mixed modules (e.g. one serial, one parallel), alternating them in certain positions, can be provided (e.g., thereby allowing for a hybrid parallel/serial aggregation within a configuration). Also, a switch on the modules can enable on-sight re-configuration from parallel to serial (or vice versa) and/or using two different wiring configurations of the same module. According to one or more embodiments, a hybrid configuration can be provided where strings includes modules wired in parallel while the strings themselves are wired in series. This hybrid configuration can result in 1,1600 volts with a moderate current.

According to one or more embodiments, an intelligent solar racking system is provided. The intelligent solar racking system includes a racking frame configured to receive and mechanically support one or more solar modules. The intelligent solar racking system includes a plurality of sensors distributed throughout the racking frame. Each of the plurality of sensors configured to detect and report parameter data by generating output signals. The plurality of sensors include one or more module sensors positioned to associate with each of the one or more solar modules and detect at least a module presence as the parameter data for the one or more solar modules. The intelligent solar racking system includes at least one computing device configured to receive, store, and analyze the output signals to determine and monitor operations of the intelligent solar racking system.

According to one or more embodiments or any of the intelligent solar racking system embodiments herein, the plurality of sensors can include one or more frame sensors associated with and distributed throughout the racking frame.

According to one or more embodiments or any of the intelligent solar racking system embodiments herein, the racking frame can be configured to electrically connect each of the one or more solar modules upon that solar module being inserted into the racking frame.

According to one or more embodiments or any of the intelligent solar racking system embodiments herein, the one or more solar modules can include at least one transmissive solar module.

According to one or more embodiments or any of the intelligent solar racking system embodiments herein, the at least one computing device can be configured to collect the output signals from one or more frame sensors of the plurality of sensors associated with and distributed throughout a second racking frame of the intelligent solar racking system.

According to one or more embodiments or any of the intelligent solar racking system embodiments herein, the parameter data can include one or more of voltage, temperature, current, solar irradiation, wind, and ambient temperature.

According to one or more embodiments or any of the intelligent solar racking system embodiments herein, the parameter data can include environmental and electrical attributes of the racking frame or an individual module of the plurality of solar modules installed in the racking frame.

According to one or more embodiments or any of the intelligent solar racking system embodiments herein, the at least one computing device can automatically determine a position of each of the one or more solar modules within the racking frame.

According to one or more embodiments or any of the intelligent solar racking system embodiments herein, the one or more solar modules can include an intelligent module including one or more internal sensors of the plurality of sensors.

According to one or more embodiments or any of the intelligent solar racking system embodiments herein, the one or more internal sensors can communicate with the at least one computing device once the intelligent module inserted into the intelligent solar racking system.

According to one or more embodiments or any of the intelligent solar racking system embodiments herein, at least one server can be provided and be configured to collect and analyze the operations of the intelligent solar racking system and the parameter data.

According to one or more embodiments or any of the intelligent solar racking system embodiments herein, the at least one server can include a distributed cloud based implementation enabling big data processing the operations of the intelligent solar racking system and the parameter data.

According to one or more embodiments or any of the intelligent solar racking system embodiments herein, the at least one server can determine a degradation or suboptimal performance of any module of the one or more solar modules by analyzing the operations of the intelligent solar racking system and the parameter data.

According to one or more embodiments or any of the intelligent solar racking system embodiments herein, the at least one server can determine long term trends of the intelligent solar racking system by analyzing the operations of the intelligent solar racking system and the parameter data.

According to one or more embodiments or any of the intelligent solar racking system embodiments herein, the at least one server can generate automatic feedback to the at least one computing device to optimize or reconfigure an electrical operation of the intelligent solar racking system by bypassing or isolating at least one of the one or more solar modules or by adjusting voltage levels or current levels.

According to one or more embodiments or any of the intelligent solar racking system embodiments herein, the at least one server can generate feedback to third-party intelligent systems to take actions that optimize an electrical output of the intelligent solar racking system.

According to one or more embodiments, a method is provided. The method includes monitoring, by at least one computing device, output signals generated by a plurality of sensors distributed throughout a racking frame of an intelligent solar racking system. Each of the plurality of sensors configured to detect and report parameter data in the output signals. The racking frame configured to receive and mechanically support one or more solar modules. The plurality of sensors comprising one or more module sensors positioned to associate with each of the one or more solar modules. The method includes determining, by the at least one computing device, operations of the intelligent solar racking system based on the output signals.

According to one or more embodiments or any of the method embodiments, the plurality of sensors can include one or more frame sensors associated with and distributed throughout the racking frame. The one or more module sensors can also detect at least a module presence as the parameter data for the one or more solar modules.

According to one or more embodiments or any of the method embodiments, the racking frame can be configured to electrically connect each of the one or more solar modules upon that solar module being inserted into the racking frame.

According to one or more embodiments or any of the method embodiments, the at least one computing device can be configured to collect the output signals from one or more frame sensors of the plurality of sensors associated with and distributed throughout a second racking frame of the intelligent solar racking system.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. A computer readable medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Examples of computer-readable media include electrical signals (transmitted over wired or wireless connections) and computer-readable storage media. Examples of computer-readable storage media include, but are not limited to, a register, cache memory, semiconductor memory devices, magnetic media such as internal hard disks and removable disks, magneto-optical media, optical media such as compact disks (CD) and digital versatile disks (DVDs), a random access memory (RAM), a read-only memory (ROM), an erasable programmable read-only memory (EPROM or Flash memory), a static random access memory (SRAM), and a memory stick. A processor in association with software may be used to implement a radio frequency transceiver for use in a terminal, base station, or any host computer.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A solar racking system comprising:
    a racking frame receiving and mechanically supporting a plurality of solar modules in a vertical order; and
    a plurality of sensors distributed throughout the solar racking system, each of the plurality of sensors generating parameter data and reporting the parameter data as output signals, comprising:
        at least two frame sensors located on the racking frame, positioned to associate with each of the plurality of solar modules, and detecting at least a module position and presence within the racking frame as the parameter data; and
    at least one computing device receiving and analyzing the output signals to determine and monitor operations of the solar racking system.

2. The solar racking system of claim 1, wherein the racking frame electrically connects each of the plurality of solar modules upon that solar module being inserted into the racking frame.

3. The solar racking system of claim 1, wherein the plurality of solar modules comprise at least one transmissive solar module.

4. The solar racking system of claim 1, wherein the parameter data comprises one or more of voltage, temperature, current, solar irradiation, and wind.

5. The solar racking system of claim 1, wherein the parameter data comprises environmental and electrical attributes of the racking frame or an individual module of the plurality of solar modules installed in the racking frame.

6. The solar racking system of claim 1, wherein the at least one computing device automatically determines a position of each of the plurality of one or more-solar modules within the racking frame.

7. The solar racking system of claim 1, wherein the plurality of solar modules comprise a first solar module comprising one or more module sensors.

8. The solar racking system of claim 7, wherein the one or more module sensors communicate with the at least one computing device once the first module is inserted into the solar racking system.

9. The solar racking system of claim 1, further comprising:
    at least one server collecting and analyzing the operations of the solar racking system and the parameter data.

10. The solar racking system of claim 9, wherein the at least one server comprises a distributed cloud based implementation enabling big data processing of the operations of the solar racking system and the parameter data.

11. The solar racking system of claim 9, wherein the at least one server determines a degradation or suboptimal performance of any module of the plurality of solar modules by analyzing the operations of the solar racking system and the parameter data.

12. The solar racking system of claim 9, wherein the at least one server determines long term trends of the solar racking system by analyzing the operations of the solar racking system and the parameter data.

13. The solar racking system of claim 9, wherein the at least one server generates automatic feedback to the at least one computing device to optimize or reconfigure an electrical operation of the solar racking system by bypassing or isolating at least one of the plurality of solar modules or by adjusting voltage levels or current levels of the at least one of the plurality of solar modules.

14. The solar racking system of claim 1, wherein each frame sensor detects a corresponding module position and presence within the racking frame by detecting a module sensor of each of the plurality of solar modules.

* * * * *

UNITED STATES PATENT AND TRADEMARK OFFICE
CERTIFICATE OF CORRECTION

| | | |
|---|---|---|
| PATENT NO. | : 12,231,080 B2 | Page 1 of 2 |
| APPLICATION NO. | : 17/841442 | |
| DATED | : February 18, 2025 | |
| INVENTOR(S) | : Kurt G. Conti and Cullin J. Wible | |

It is certified that error appears in the above-identified patent and that said Letters Patent is hereby corrected as shown below:

On the Title Page

On Page 3, item [56], in Column 2, Lines 23-24, delete "1582341820082/Prism+Solar+~+BN72+~+Gen2+-+360-370W+~+v1.2.pdf" and insert -- 1582341820082/Prism+Solar+-+BN72+-+Gen2+-+360-370W+-+v1.2.pdf --, therefor.
On Page 3, in item [56], in Column 2, Lines 52-53, delete "CDTE-Based" and insert -- CdTe-Based --, therefor.

In the Drawings

In Fig. 2, Sheet 2 of 6, delete "TRANSMITANCE" and insert -- TRANSMITTANCE --, therefor.
In Fig. 2, Sheet 2 of 6, delete "TRANSMITANCE" and insert -- TRANSMITTANCE --, therefor.

In the Specification

In Column 2, Line 24, delete "diagrams a" and insert -- diagrams of a --, therefor.
In Column 2, Line 51, delete "optimization the" and insert -- optimization of the --, therefor.
In Column 4, Line 50, delete "managed a" and insert -- managed by a --, therefor.
In Column 5, Line 23, delete "electricity the" and insert -- electricity to the --, therefor.
In Column 6, Line 55, delete "represented as" and insert -- represented by --, therefor.
In Column 8, Line 66, delete "1200nanometers." and insert -- 1200 nanometers. --, therefor.
In Column 10, Line 57, delete "module" and insert -- module are --, therefor.
In Column 12, Lines 21-22, delete "captured by and analyzes by" and insert -- captured and analyzed by --, therefor.
In Column 12, Line 62, delete "example." and insert -- example, --, therefor.
In Column 13, Line 32, delete "355 a" and insert -- 355 is a --, therefor.
In Column 17, Lines 1-2, delete "produce in" and insert -- produce --, therefor.
In Column 17, Line 2, delete "550 an" and insert -- 550 and --, therefor.
In Column 17, Line 37, delete "operation" and insert -- operate --, therefor.
In Column 18, Line 35, delete "355 a" and insert -- 355 is a --, therefor.

Signed and Sealed this
Twenty-second Day of April, 2025

Coke Morgan Stewart
*Acting Director of the United States Patent and Trademark Office*

CERTIFICATE OF CORRECTION (continued)
U.S. Pat. No. 12,231,080 B2

In Column 19, Line 18, delete "then" and insert -- than --, therefor.
In Column 19, Line 51, delete "110" and insert -- 110. --, therefor.
In Column 20, Line 45, delete "that that" and insert -- that --, therefor.
In Column 21, Line 65, delete "processing the" and insert -- processing of the --, therefor.
In Column 23, Line 45, delete "one more" and insert -- one or more --, therefor.

In the Claims

In Column 24, Line 26, in Claim 6, delete "one or more-solar modules" and insert -- solar modules --, therefor.